United States Patent [19]

Ishibashi et al.

[11] Patent Number: 5,100,234

[45] Date of Patent: * Mar. 31, 1992

[54] METHOD AND APPARATUS FOR ALIGNING TWO OBJECTS, AND METHOD AND APPARATUS FOR PROVIDING A DESIRED GAP BETWEEN TWO OBJECTS

[75] Inventors: Yoriyuki Ishibashi, Kawasaki; Ryoichi Hirano, Tokyo; Kyoji Yamashita, Yokohama, all of Japan

[73] Assignee: Kabushiki Kaisha Toshiba, Kawasaki, Japan

[*] Notice: The portion of the term of this patent subsequent to Jan. 29, 2008 has been disclaimed.

[21] Appl. No.: 538,186

[22] Filed: Jun. 13, 1990

Related U.S. Application Data

[63] Continuation-in-part of Ser. No. 291,276, Dec. 28, 1988, Pat. No. 4,988,197.

[30] Foreign Application Priority Data

Dec. 28, 1987 [JP] Japan .................. 62-334716
Dec. 28, 1987 [JP] Japan .................. 62-334774
Mar. 31, 1988 [JP] Japan .................. 63-78864
Sep. 30, 1988 [JP] Japan .................. 63-243810

[51] Int. Cl.$^5$ ............................................. G01B 9/02
[52] U.S. Cl. ................................. 356/349; 356/363; 356/356
[58] Field of Search ............... 356/349, 356, 363, 401; 250/237 G

[56] References Cited

U.S. PATENT DOCUMENTS

| | | | |
|---|---|---|---|
| 4,693,605 | 9/1987 | Sommargren | 356/349 |
| 4,710,026 | 12/1987 | Magome et al. | 356/349 |
| 4,815,850 | 3/1989 | Kanayama et al. | 356/349 |
| 4,838,693 | 6/1989 | Uchida et al. | 356/356 |
| 4,988,197 | 1/1991 | Ishibashi et al. | 356/349 |

Primary Examiner—Samuel Turner
Attorney, Agent, or Firm—Oblon, Spivak, McClelland, Maier & Neustadt

[57] ABSTRACT

A first diffraction grating is formed on a mask, and a second diffraction grating is formed on a wafer. Two light beams having slightly different frequencies interfere with each other and are diffracted as they travel through the first diffraction grating, are reflected by the second diffraction grating, and again pass through the first diffraction grating. As a result, they change into thrice diffracted light beams. The diffracted light beams are combined into a detection light beam which has a phase shift $\phi_A$ representing the displacement between the wafer and the mask, or a phase shift $\phi_G$ representing the gap between the wafer and the mask. The detection light beam is converted into a detection signal. The phase difference between the detection signal and a reference signal having no phase shifts are calculated, thus determining phase shift $\phi_A$ or $\phi_G$. The displacement or the gap is determined from the phase shift. In accordance with the displacement or the gap, the wafer and the mask are aligned to each other, or the gap between them is adjusted to a desired value. Since the detection signal is generated from diffracted light beams, its S/N ratio is sufficiently great. Therefore, the displacement or the gap is determined with high precision. In addition, it is possible with the invention to perform the aligning of the wafer and the mask and the adjusting of the gap therebetween, simultaneously. Further, the incident light may be either circularly polarized light or non-polarized light.

21 Claims, 31 Drawing Sheets

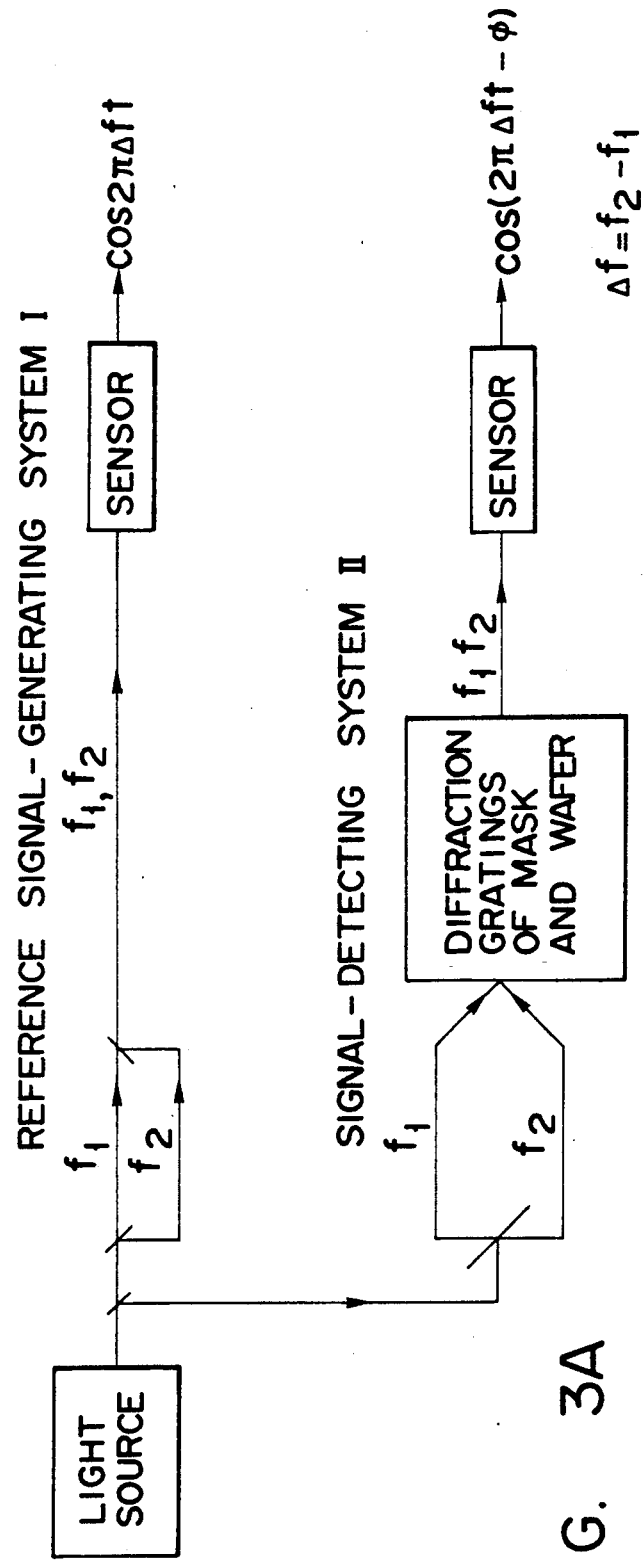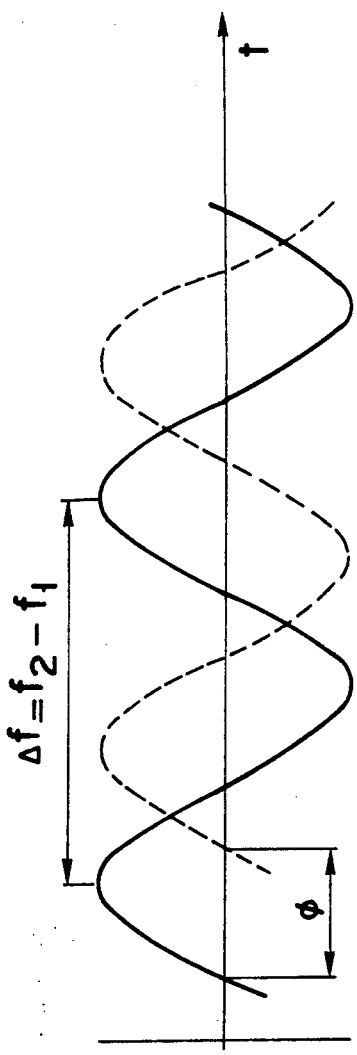
F I G. 3A
F I G. 3B

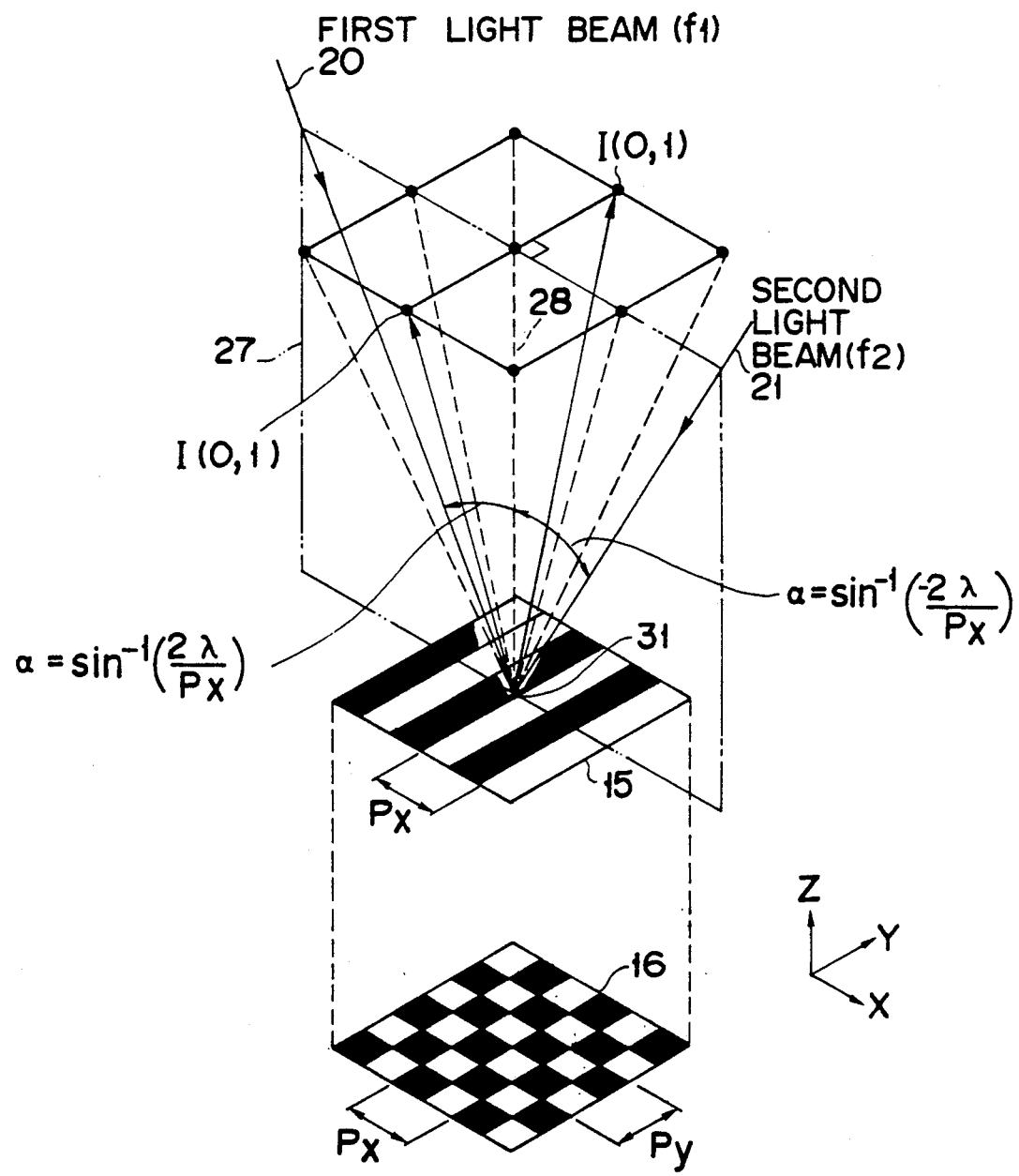
F I G. 4

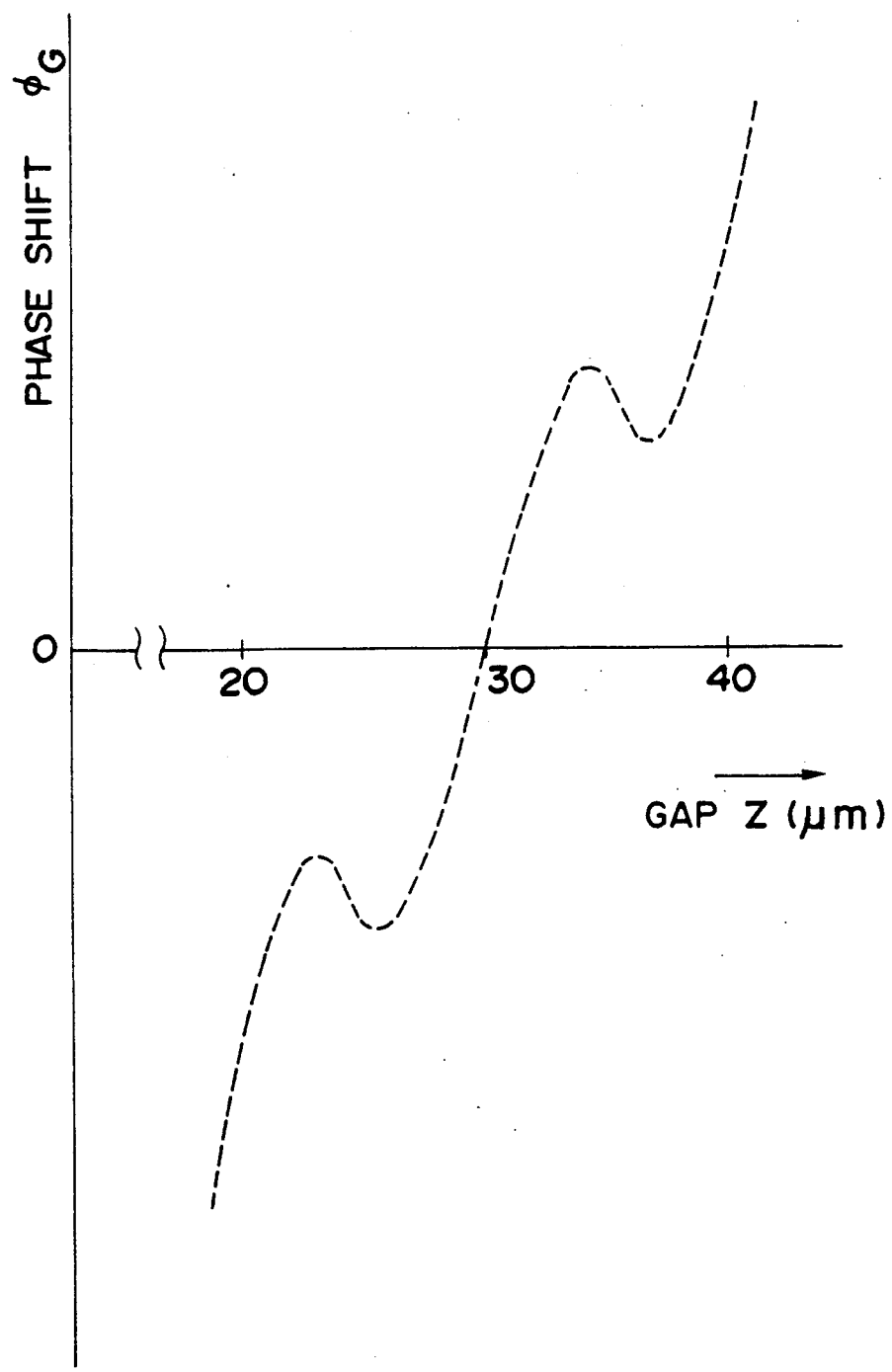
F I G. 12

METHOD AND APPARATUS FOR ALIGNING TWO OBJECTS, AND METHOD AND APPARATUS FOR PROVIDING A DESIRED GAP BETWEEN TWO OBJECTS

The present application is a continuation-in-part of copending U.S. Pat. application 07/291,276, filed Dec. 28, 1988 now U.S. Pat. No. 4,988,197.

BACKGROUND OF THE INVENTION

1. Field of the Invention

The present invention relates to a method and an apparatus for aligning a first object an a second object, and also to a method and an apparatus for providing a desired gap between a first and a second object. More particularly, the invention relates to a method and an apparatus for aligning a mask and a wafer to transfer a circuit pattern image onto the wafer, and also to a method and an apparatus for providing a desired gap between a mask and a wafer to transfer a circuit pattern image onto the wafer.

2. Description of the Related Art

In manufacturing a semiconductor device such as a VLSI, an exposure apparatus transfers the circuit pattern of the device onto a semiconductor wafer. More specifically, the apparatus applies X-rays to a mask having the circuit pattern, and those X-rays passing through the mask are then applied to the wafer, thereby transferring the image of the pattern onto the wafer. In order to transfer the circuit pattern onto the wafer, it is necessary to align the mask and the wafer correctly with respect to each other, and also to provide a desired gap between the mask and the wafer.

The inventors hereof have proposed a method and an apparatus for aligning objects which can be applied to the transfer of a circuit pattern onto a semiconductor wafer, in U.S. Pat. Application No. 07/060,663 and also in the corresponding West German Patent Application P 37 19 539.5. In the method claimed in these patent applications, two diffraction gratings are formed on the mask and the wafer, respectively. A laser beam is applied to the diffraction grating on the mask, and is diffracted as it passes through the grating. The diffracted beam is applied to the diffraction grating on the wafer, and is diffracted as it passes through this grating. The laser beam, twice diffracted, is reflected from the wafer and applied back to the grating of the mask through the grating of the wafer. Hence, the beam is diffracted for the third time by the grating of the mask, thus forming a thrice diffracted light beam. The intensity of this light beam, which represents the displacement of the mask with respect to the wafer, is detected by a photosensor. The photosensor generates an electrical signal. In accordance with the signal, an aligning mechanism moves the mask, thereby correctly aligning the mask with respect to the wafer.

The reflectivity of the diffraction grating formed on the wafer may alter, and the permeability of the diffraction grating formed on the mask may also change. In particular, the reflectivity of the grating formed on the wafer changes ten and odd times during the process of manufacturing a VLSI. This is because the wafer is exposed to light ten and odd times during the manufacture of the VLSI, and resist is coated on the wafer each time the wafer is exposed to the light.

Whenever the reflectivity of the grating formed on the wafer or the permeability of the grating formed on the mask alters, the intensity (i.e., amplitude) of the thrice diffracted light beam changes. Consequently, the signal output by the photosensor has an insufficient S/N ratio. Due to the small S/N ratio of the signal, the aligning mechanism can no longer align the mask with respect to the wafer, with the required precision.

The gap between the mask and the wafer is adjusted to a desired value, also in accordance with the intensity of the thrice diffracted light beam. Therefore, the gap cannot be adjusted as accurately as desired, whenever the reflectivity of the grating formed on the wafer or the permeability of the grating formed on the mask varies, inevitably changing the intensity of the thrice diffracted light beam, and ultimately causing the photosensor to generate an electrical signal having an insufficient S/N ratio.

SUMMARY OF THE INVENTION

One of the primary objects of the present invention is to provide a method and an apparatus for aligning two objects with a sufficient precision, in accordance with an electrical signal which represents the phase shift of diffracted light and which has a great S/N ratio.

Another primary object of the invention is to provide a method and an apparatus for spacing apart two objects at a desired distance, in accordance with an electrical signal which represents the phase shift of diffracted light and which has a great S/N ratio.

Still another primary object of the present invention is to provide a method and an apparatus for not only aligning two objects with a sufficient precision, but also spacing apart two objects for a desired distance, in accordance with an electrical signal which represents the phase shift of diffracted light and which has a great S/N ratio.

A secondary object of this invention is to provide a method and an apparatus for aligning two objects with a sufficient precision, regardless of the distance between the objects, in accordance with an electrical signal converted from diffracted light of a selected order which has been diffracted by a selected type of a diffraction grating.

Another secondary object of this invention is to provide a method and an apparatus for spacing apart two objects at a desired distance, regardless of the displacement of the first object with respect to the second object, in accordance with an electrical signal converted from diffracted light of a selected order which has been diffracted by a selected type of a diffraction grating.

Still another secondary object of the present invention is to provide a method and an apparatus for not only aligning two objects with a sufficient precision, but also spacing apart two objects at a desired distance, in accordance with an electrical signal converted from light beams which are supplied from a light source and then are diffracted by diffraction gratings.

A further secondary object of this invention is to provide a method and an apparatus for aligning two objects, a method and an apparatus for spacing apart two objects, and a method and an apparatus capable of simultaneously aligning and spacing apart two objects, with sufficient accuracy, in spite of various external disturbances.

According to the present invention, there is provided a method of aligning first and second objects opposing each other, the first object having a first diffraction grating formed on that surface which opposes the second object, and the second object having a second diffraction grating formed on that surface which opposes the first object, the method comprising the steps of:

emitting from a light source a first light beam having a frequency f1 and a second light beam having a frequency f2, where f1 is not equal to f2;

applying the first and second light beams onto one of first and second diffraction gratings so that the first and second light beams interfere with each other and are diffracted by the first diffraction grating and a second diffraction grating, whereby the first light beam is changed into at least twice diffracted light beams having the frequency f1, and the second light beam is changed into at least twice diffracted light beams having frequency f2, two beams of arbitrary same order of the diffracted light beams which have frequencies f1 and f2 and are interfering each other, and two beams of specified same order of the diffracted light beams which have frequencies f1 and f2 and a phase shift $\phi_A$ which corresponds to a displacement between the first and second objects;

detecting and converting, by a first sensor means, the two beams of the specified same order into a beat signal, i.e., a detection signal having a frequency $\Delta f$ $(= |f2-f1|)$ and the phase shift $\phi_A$;

applying a third light beam having the frequency f1 and being in phase with the first light beam, and a fourth light beam having frequency f2, being in phase with the second light beam, and interfering with the third light beam;

detecting and converting, by a second sensor means, the third and fourth light beams into a beat signal, i.e., a reference signal having a frequency $\Delta f$ $(= |f2-f1|)$;

calculating a phase difference between the detection signal and the reference signal, thereby to determine the phase shift $\phi_A$ and thus the displacement between the first and second objects; and adjusting the first and second objects relative to each other in accordance with the displacement, thereby to align the first and second objects with respect to each other.

Further, in the present invention the incident light is preferably either circularly polarized light or non-polarized light.

In the method of aligning two objects, according to the invention, the first object is moved parallel to the second object in accordance with the phase shift of diffracted light, which represents the displacement of the first object to the second, not in accordance with the intensity (i.e., amplitude) of the light. The phase shift of the light diffracted by a diffraction grating does not alter at all even if the reflectivity or permeability of the grating changes. Hence, the S/N ratio of an electrical signal generated from the phase shift of the diffracted light remains sufficiently great even if the reflectivity or permeability of the grating varies. As a result, with the method according to the invention it is possible to align the objects with adequate precision.

In the method of spacing apart two objects for a desired distance, according to the invention, the first object is moved toward or away from the second object in accordance with the phase shift of diffracted light, which represents the gap between the first object and the second, not in accordance with the intensity (i.e., amplitude) of the light. Hence, for the same reason stated in the preceding paragraph, it is possible with the method to spacing apart two objects for a desired distance, with adequate precision.

Moreover, in the method of the present invention, for simultaneously aligning and spacing apart two objects, the first object is moved parallel to and also toward or away from the second object in accordance with the phase shift of diffracted light, which represents the displacement of the first object to the second and the gap between them, not in accordance with the intensity (i.e., amplitude) of the light. Hence, for the same reason stated above, it is possible with the method to align the objects with adequate precision and also to space them apart by a desired distance.

BRIEF DESCRIPTION OF THE DRAWINGS

FIGS. 3A and 3B are diagrams explaining the optical heterodyne interference method;

FIG. 4 is a diagram representing the two-dimensional distribution of the thrice diffracted light beam obtained when a light beam is applied to a diffraction grating of the mask perpendicular to the y axis;

FIG. 12 is a graph illustrating the relationship between the gap between the mask and the wafer and the phase shift of the thrice diffracted light beam;

DETAILED DESCRIPTION OF THE PREFERRED EMBODIMENTS

One embodiment of the present invention will now be described with reference to FIG. 1 through FIG. 9.

Figure 1:
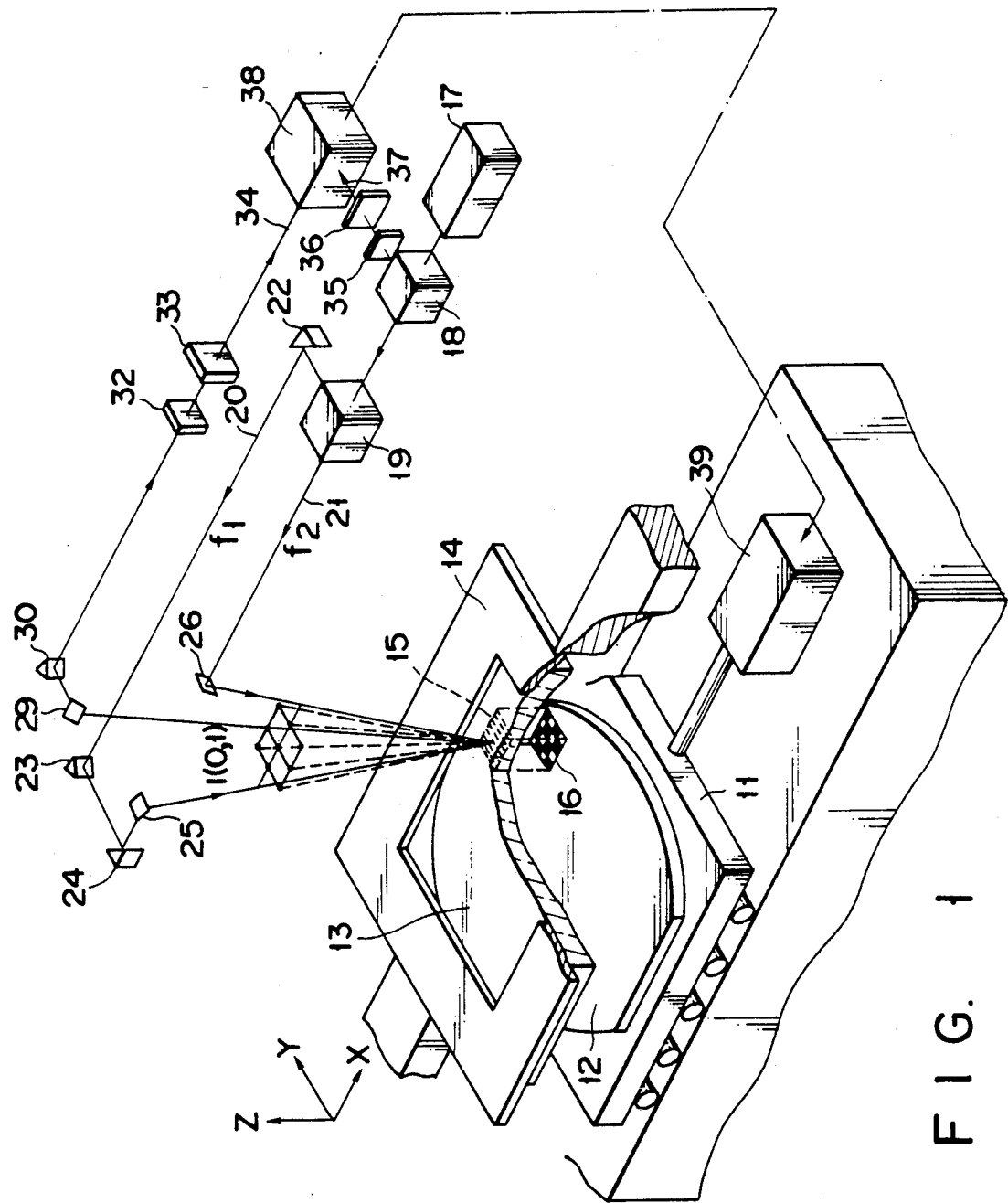
FIG. 1 is a perspective view showing an apparatus according to a first embodiment of the invention, which is designed to align an X-ray exposure mask and a semiconductor wafer.
Figure 2:
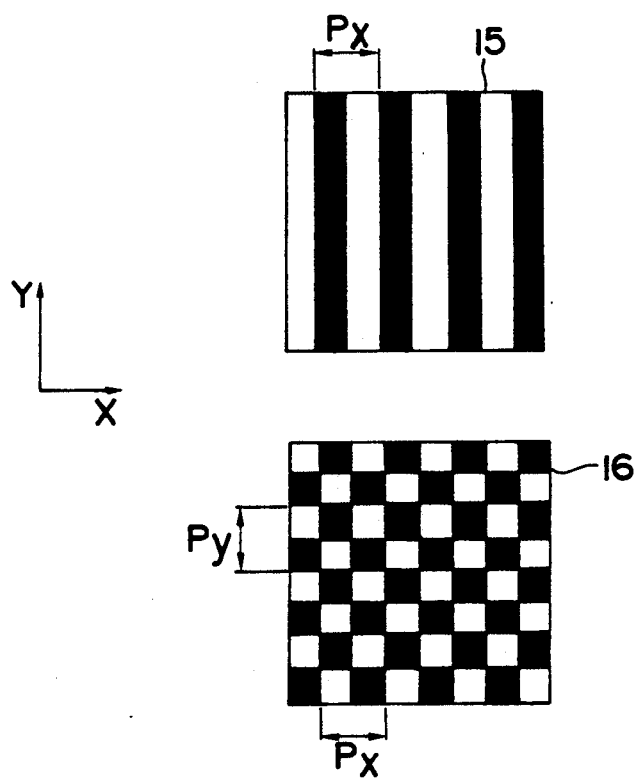
FIG. 2 shows plan views of the diffraction gratings used in the aligning apparatus shown in FIG. 1.

FIG. 1 illustrates the first embodiment of the present invention, i.e., an apparatus for aligning an X-ray exposure mask and a semiconductor with respect to each other. More specifically, this apparatus is designed to move semiconductor wafer 12 in the x axis in a horizontal plane, to appropriately align wafer 12 with respect to X-ray exposure mask 13.

As is shown in FIG. 1, the apparatus comprises wafer table 11 which can move in the x axis, and mask holder 14 which can move in the z axis perpendicular to the horizontal plane consisting of the x axis and also the y axis. The y axis is perpendicular to the x axis. Wafer 12 is placed on wafer table 11, and mask 13 is held by mask holder 13. Mask holder 14 is located above wafer table 11 such that mask 13 is spaced apart from wafer 12 in the z axis for a predetermined distance.

First diffraction grating 15, which is of a light-permeating type, is mounted on mask 13 at a prescribed portion thereof. Second diffraction grating 16 is mounted on that portion of wafer 12 which opposes the first diffraction grating 15. These two diffraction gratings 15 and 16 have the patterns shown in FIG. 2. The pattern of first grating 15 is one-dimensional and consists of a plurality of parallel stripes (concave or convex portions) which extend in the y axis, and are spaced apart from one another at pitch Px in the x axis. The pattern of second grating 16 is checked and consists of rows of squares spaced apart at pitch Py in the y axis, and columns of squares spaced apart at pitch Px in the x axis.

The apparatus shown in FIG. 1 employs the so-called optical heterodyne interference method. The principles of this method will now be explained.

To perform the optical heterodyne interference method, the two systems shown in FIG. 3A are required, i.e., the reference signal-generating system I for generating a reference signal, and the signal-detecting system II for generating a detection signal. In the reference signal-generating system I, a deflecting filter splits the light beam emitted by a light source, into two light beams having frequencies of f1 and f2. These light beams are combined into interference light, which is converted by a sensor into a beat signal, i.e., a reference signal. The reference signal has frequency $\Delta f (=f2-f1)$. It's phase is identical to that of the light beam emitted by the light source. Hence, the reference signal can be represented as: $\cos 2\pi ft$, where t is time.

In the signal-detecting system II, the light beam emitted from the light source is split into two light beams, i.e., first light beam having frequency f1 and second light beam having frequency f3 (f1≠f2). These light beams are diffracted by diffraction gratings 15 and 16, and, at the same time, interfere with each other to be combined. As a result, the first light beam is changed to a thrice diffracted light beam having frequency f1 and consisting of (n, r) order beams; the second light beam is changed to a thrice diffracted light beam having frequency f2 and consisting of (n, r) order beams, where n and r are integral numbers. Two beams of arbitrary same order of two thrice diffracted light beams are interference beams. Two beams of same order have phase shift $\phi$, which will be later described in detail. These light beams of the same order are applied to a sensor. The sensor converts them into a beat signal, i.e., a detection signal. This signal has frequency $\Delta f (=|f2-f1|)$, and has phase shift $\phi$ with respect to the light beam emitted from the light source. Thus, the detection signal is represented as $\cos(2\Delta f - \phi)$.

FIG. 3B shows the waveform of the reference signal which the reference signal-generating system I has generated, and also the waveform of the detection signal which the signal-detecting system II has produced. As is evident from this figure, the difference in phase between these signals is identical with the phase shift $\phi$. The phase shift $\phi$ represents either the displacement $\Delta x$ between wafer 12 and mask 13 or the gap z between wafer 12 and mask 13. Wafer 12 and mask 13 are aligned with respect to each other until the phase shift comes to have a predetermined value. Alternatively, the gap between wafer 12 and mask 13 is adjusted until the phase shift $\phi$ changes to a predetermined value.

Referring back to FIG. 1, the apparatus according to the first embodiment of this invention is provided with an optical system for achieving the optical heterodyne interference method. This optical system has laser 17 of Zeemen-effect type. Laser 17 emits a composite light beam which consists of two light beams having frequencies f1 and f2 which are a little different from each other. This composite light beam has been linearly deflected. The composite light beam is applied to beam splitter 18. Beam splitter 18 splits the composite light beam into two components. One component which has frequencies f1 and f2 is used for obtaining a reference signal, and the other component which has frequencies f1 and f2 is used for obtaining a detection signal.

The other component of the composite light beam is applied to deflected beam splitter 19. Beam splitter 19 splits the other component into first light beam 20 having frequency f1 and second light beam 21 having frequency f2. Light beam 20 is reflected by mirrors 22, 23, 24, and 25 and ultimately applied onto first diffraction grating 15. Light beam 21 is reflected by mirror 26 and applied onto first diffraction grating 15 formed on mask 13.

As is illustrated in FIG. 4, first light beam 20 and second light beam 21 are applied in virtual plane 27, symmetrically with respect to axis 28, at incidence angle of $\alpha = \sin^{-1}(+\pm 2\lambda/Px)$, such that they meet at intersection 31 of axis 28 and first diffraction grating 15. Virtual plane 27 extends at right angles to the y axis, and axis 28 exist in this plane 27 and extends at right angles to first diffraction grating 15.

The first and second light beams are diffracted for three times, and, at the same time, interfere with each other to be combined. More specifically, the first and second light beams are diffracted, for the first time, as they pass through first diffraction grating 15. They are further applied to second diffraction grating 16 and diffracted, for the second time, as they are reflected by grating 16. Twice diffracted light beams are applied back to first grating 15 and diffracted, for the third time, as they pass through this diffraction grating. As a result, first and second light beams 20 and 21 have been changed to two thrice diffracted light beams having frequencies f1 and f2, respectively, and consisting of (n, r) order beams, where n and r are integral numbers. Two beams of arbitrary same order of two thrice diffracted light beams are interference beams. Two beams of (0, 1) order of two thrice diffracted light beams will be detected. The two beams of (0, 1) order define phase shift $\phi_A$ which represents displacement $\Delta x$ between wafer 12 and mask 13, but does not represent gap z between wafer 12 and mask 13, as is described latter in detail. The two beams of (0, 1) order are reflected first by mirror 29 and then by mirror 30, and are supplied to a signal-processing section.

The signal-processing section comprises two deflection plates 32 and 35, two photosensors 33 and 36, and phase meter 38. The two light beams of the (0, 1) order are supplied via deflection plate 32 to photosensor 33. Photosensor 33 converts these beams into a beat signal having frequency $\Delta f$ $(=|f2-f1|)$ and phase shift $\phi$. The beat signal is input, as a detection signal 34, to phase meter 38.

In the meantime, one component of the composite light beam, which has been split by beam splitter 18 and has frequencies f1 and f2, is supplied via deflection plate 35 to photosensor 36. Photosensor 36 converts one component into a beat signal having frequency $\Delta f$ $(=|f2-f1|)$ and no phase shift. This beat signal is input, as a reference signal 37, to phase meter 38.

Phase meter 38 calculates the phase difference between detection signal 34 and reference signal 37, thus finding phase shift $\phi_A$. As may be understood from FIG. 5, phase shift $\phi_A$ is substantially proportional to the displacement $\Delta x$. Therefore, when wafer 12 and mask 13 are moved such that phase shift $\phi_A$ is reduced to nil, they will be so positioned that the displacement $\Delta x$ is reduced to zero. More precisely, the signal output by phase meter 38, which represents phase shift $\phi_A$, is supplied to table-driving device 39. In accordance with this signal, device 39 drives wafer table 11 such that wafer 12 is moved until phase shift $\phi_A$ becomes nil.

A component of either light beam 20 or 21 may be reflected and diffracted by first diffraction grating 15. If this is the case, the reflected and diffracted component is transferred in only virtual plane 27 as is shown in FIG. 4. As has been described, two beams of (0, 1) order of the thrice diffracted light beams are detected by photosensor 33. Therefore, the component of either light beam 20, 21, which has been reflected and diffracted by first grating 15, does not interfere with two light beams of (0, 1) order. Obviously, this component of either light beam 20, 21 does not affect the precision of detection of the two beams of (0, 1) order.

The apparatus shown in FIG. 1 can position wafer 12 and mask 13 with high precision, regardless of the gap between wafer 12 and mask 13. In other words, the phase shift $\phi_A$ does not depends on the gap between wafer 12 and mask 13 as long as photosensor 33 detects two beams of (0, 1) order thrice diffracted light beams. The reason will be discussed below.

The order to diffraction in the x axis and the y axis is represented as (n, r). When a light beam having frequency f is applied to first grating 15 at incidence angle $\alpha$, two light beams of the (n, r) order of thrice diffracted light beams will be detected which has the intensity I(n, r). Intensity I(n, r) is given as follow:

$$I(n,r) \propto \left| \sum_{k=-\infty}^{+\infty} \sum_{l=-\infty}^{+\infty} M^C{}_K \cdot W^C(l,4) \cdot M^C{}_m \cdot \right.$$

$$\exp\{-1(k+m)X\} \cdot \exp[-i\{k^2 + (k+1)^2 + (Px/Py)^2 r^2\}Z] \cdot$$

$$\left. \exp\{-i(2k+1)(2\pi/Px)z \cdot \sin\alpha\} \cdot \exp(i2\pi ft) \right| \quad (1)$$

where $X = 2\pi - \Delta x/Px$, $Z = \pi\lambda z/Rx^2$, Px is the pitch at the x axis, Py is the pitch at the y axis, $\lambda$ is the wavelength of the light beam, $\Delta x$ is the displacement between wafer 12 and mask 13, $M^C{}_K$ is the k-order Fourier coefficient of first diffraction grating 15, and $W^C(l,r)$ is the (l, r) order Fourier coefficient of second diffraction grating 16, and i is an imaginary number.

As is shown in FIG. 4 and as has been pointed out, first light beam 20 having frequency f1, and the second light beam 21 having frequency f2 are applied to first diffraction grating 15 and further to second diffraction grating 16. As a result, two thrice diffracted light beams having frequencies f1 and f2 are obtained. Of the diffracted light beam having frequency f1, light beams which satisfy the conditions of $2+k_1+l_1+m_1=0=n_1$ and $r_1=\pm 1$ and have intensities of $I(n_1, r_1)=I(0,\pm 1)$, are applied to photosensor 33. Similarly, of the light beam having frequency f2, light beams which satisfy the conditions of $-2+k_2+l_2+m_2=0=n_2$ and $r_2=\pm 1$ and have intensity of $I(n_2, r_2)=I(0,\pm 1)$, are applied to photosensor 33. In other words, photosensors 33 receives the light beams of $(0, \pm 1)$ order of thrice diffracted light beams having frequencies f1 and f2.

The order beams, which satisfy the conditions of $k_1+l_1+m_1=-2$ and $k_2+l_2+m_2=2$, are selected, and lower-order diffracted beams of $\pm$ third order or lower order are taken into account. (The $\pm$ fourth order or higher order beams have very small amplitudes, and can be neglected.) The respective intensity $I(O, \pm 1)$ of thrice diffracted light beams having frequencies f1 and f2 have the following complex amplitudes:

$$U_{f1} = \frac{1}{2}(1/\pi)^3 \cdot (e^{\eta z} + e^{i\beta z}) \cdot (e^{ix} + e^{i\beta x}) \cdot e^{i2\pi t_1 t} + \quad (2)$$

$$\frac{1}{6}(1/\pi)^3 \cdot (e^{i\beta z} + e^{-iz}) \cdot e^{-ix} \cdot e^{i2\pi t_1 t}$$

$$u_{f2} = \frac{1}{2}(1/\pi)^3 \cdot (e^{i\eta z} + e^{i\beta z}) \cdot (e^{-ix} + e^{-i\beta x}) \cdot e^{i2\pi t_2 t} + \quad (3)$$

$$\frac{1}{6}(1/\pi)^3 \cdot f(e^{i\beta z} + e^{iz}) \cdot e^{ix} \cdot e^{i2\pi t_2 t}$$

From complex amplitude $U_{f1}$ and $U_{f2}$, intensity $I(0, \pm 1) = |U_{f1}+U_{f2}|$ is computed as follows:

$$I(0, \pm 1) \propto \sqrt{A^2 + B^2} \cos(2\pi \Delta ft - \phi_A)$$

where t is time, and A, B and $\phi_A$ are given as follows:

$$A = \frac{1}{2}(1/\pi)^6 \cdot (1 + \cos 4z) \cdot (\cos 2x + \tfrac{2}{3}\cos 4x + 1/9\cos 6x) + \quad (5)$$

$$\tfrac{1}{3}(1/\pi)^6 \cdot (2\cos 4z + \cos 8z + \tfrac{2}{3}\cos 4z \cos 2x +$$

$$\tfrac{1}{3}\cos 8z \cos 2x) - 1/9 (1/\pi)^6 \cdot (1 + \cos 4z)\cos 2x$$

$$B = \frac{1}{2}(1/\pi)^6 \cdot (1 + \cos 4z) \cdot (\sin 2x + \tfrac{2}{3}\sin 4x + 1/9\sin 6x) + \quad (6)$$

$$\tfrac{1}{3}(1/\pi)^6 \cdot (\tfrac{2}{3}\cos 4z \sin 2x + \tfrac{1}{3}\cos 8z \sin 2x) +$$

$$1/9 (1/\pi)^6 \cdot (1 + \cos 4z)\sin 2x$$

$$\phi_A = \tan^{-1}(B/A) \quad (7)$$

Figure 5:
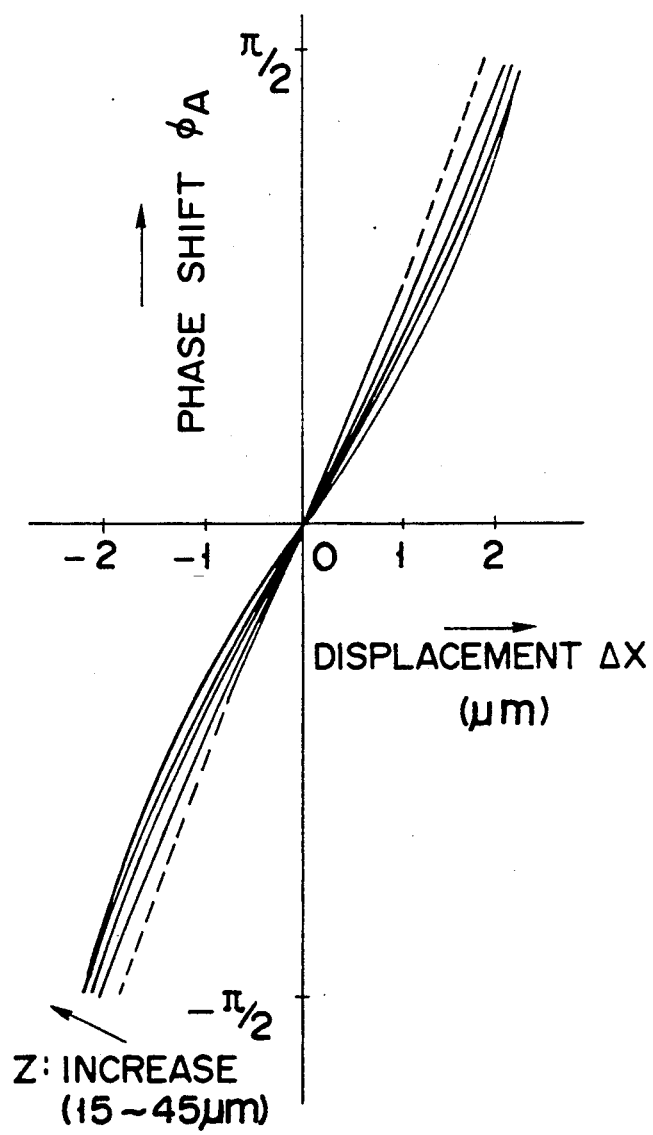
FIG. 5 is a graph illustrating the relationship between the displacement of the wafer and the phase shift of the thrice diffracted light beam.

The intensity of $(0, \pm 1)$ order beams of the thrice diffracted beams, i.e., $I(0, \pm 1)$, is compared with that of the reference signal, $I_{Ref}=a\cos|2\pi(f2-f1)|$ (where a is a constant not 0), thereby finding the phase shift $\phi_A$ between them. Using the gap z between wafer 12 and mask 13 as a parameter, the relationship between the displacement $\Delta x$ and mask 13, and the phase shift $\phi_A$ is evaluated. This relationship is shown in FIG. 5. As can be seen from FIG. 5, the positioning point, $(\phi_A, \Delta x)=(0, 0)$, does not shift as long as the gap z falls within the range of 15 to 45 $\mu$m. In this instance, $Px=15$ $\mu$m. Therefore, in the case where photosensor 33 receives of $(0, \pm 1)$ order beams of the thrice diffracted light beams, the phase shift $\phi_A$ does not vary even if the gap z changes. Hence, the displacement $\Delta x$ between wafer 12 and mask 13 is detected with sufficient accuracy, where wafer 12 and mask 13 can be aligned correctly, regardless of the gap between mask 13 and wafer 12.

Not only in the case where photosensor 33 detects light beams of the $(0, \pm 1)$ order, but also in the case where photosensor 33 receives light beams of the $(0, r)$ order (where r is an integer), the phase shift $\phi_A$ does not depend upon the gap z between wafer 12 and mask 13.

Figure 6:
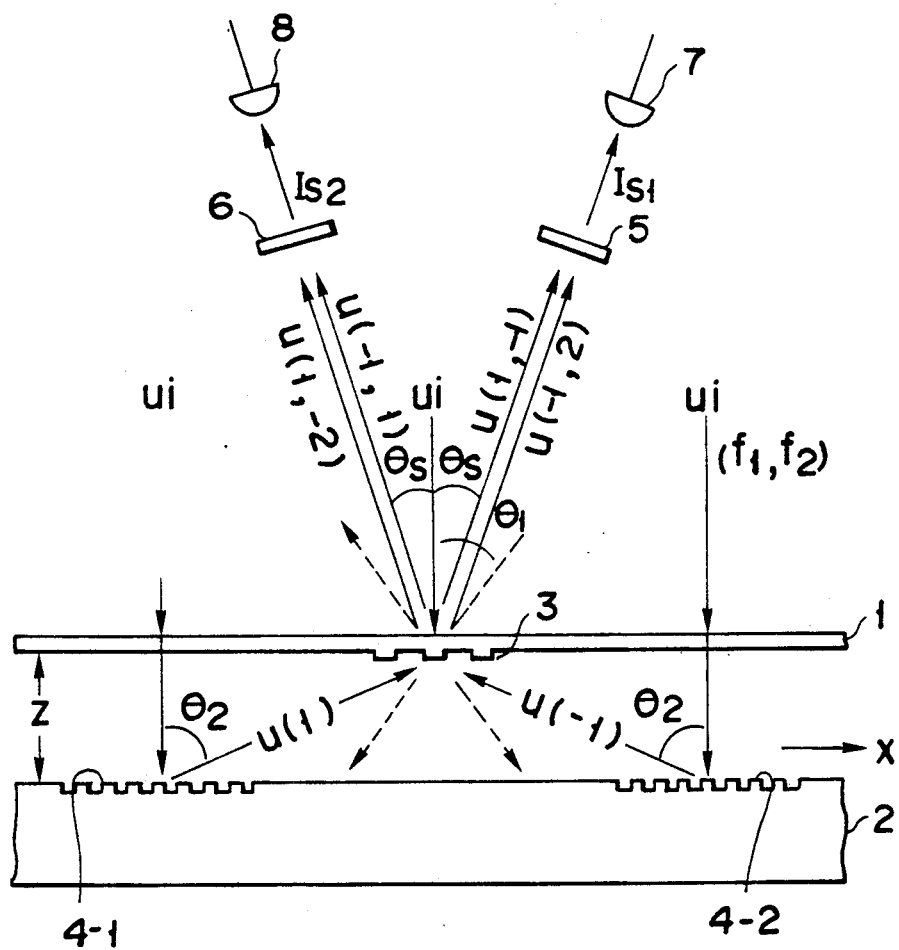
FIG. 6 is a diagram which shows an aligning apparatus employing the optical heterodyne interference method.

A method of aligning a semiconductor wafer and an X-ray exposure mask has been proposed which makes use of the optical heterodyne interference in such a way as is shown in FIG. 6. This method will be briefly explained.

As is illustrated in FIG. 6, diffraction grating 3 is formed on mask 1, and two diffraction gratings 4-1 and 4-2 are formed on semiconductor wafer 2. Three gratings 3, 4-1 and 4-2 have a one-dimensional pattern each. The pattern of grating 3 consists of parallel stripes arranged with pitch PM, whereas gratings 4-1 and 4-2 each consists of parallel stripes arranged with pitch PW. PW = ⅔ PM. Composite light beam ui, which is comprised of two light beams having frequencies f1 and f2, is applied, irradiating the entire surface of either diffraction grating formed on mask 1. Composite light beam ui is reflected and diffracted by gratings 4-1 and 4-2, so that light beams of u(i) and u(2) order of once diffracted light beams are applied to grating 3 to be diffracted by it. As a result, light beams of u(1, −1) and u(−1, 2) order of twice diffracted light beams are applied via diffraction filter 5 to photosensor 7, and simultaneously light beams of u(−1, 1) and u(1, −2) order of twice diffracted light beams are applied through deflection filter 6 to photosensor applied 8. Photosensor 7 converts beams u(1, −1) and u(−1, 2) into a beat signal Is1, and photosensor 8 converts beams u(1, −1) and u(−1, 2) into a beat signal Is2. The phase difference between signals Is1 and Is2, is detected, so that the displacement between mask 1 and wafer 2 is determined. However, this method of aligning the wafer and the mask has three drawbacks.

The first drawback is that mask 1 and wafer 2 must be preliminarily aligned to some accuracy even before they are aligned by this method. To be more precise, it is necessary to apply only the light beams of the specific order from gratings 4-1 and 4-2 formed on wafer 2 onto the grating formed on mask 1. To this end, the stripes of both gratings 4-1 and 4-2 are arranged with extremely small pitch PW. For example, PW is 0.72 $\mu$m, whereas PM is 1.08 $\mu$m. In this case, however, the displacement between mask 1 and wafer 2, which falls outside the range of $\pm 0.18$ $\mu$m, cannot be detected. Hence, a preliminary aligning of mask 1 and wafer 2 must be carried out to reduce the displacement to a value falling within that range in order to align mask 1 and wafer 2 with sufficient accuracy.

The second drawback of the method shown in FIG. 6 is that mask 1 and wafer 2 cannot be aligned with high precision when the gap between mask 1 and wafer 2 falls within the range of 20 to 30 $\mu$m, which is a required condition for a practical pattern transfer by means of X-ray exposure. As is shown in FIG. 6, it is at a constant angle that diffraction gratings 4-1 and 4-2 formed on wafer 2 diffract light beams of the specific order. Therefore, if the gap between mask 1 and wafer 2 is changed, the light beams do not illuminate diffraction grating 3 formed on mask 1, and light beams of other orders are applied to grating 3. An error will be inevitable in determining the displacement between mask 1 and wafer 2. Hence, it is impossible with this method to align mask 1 and wafer 2 with adequate accuracy if the gap between mask 1 and wafer 2 does not remain unchanged.

The third drawback of this method is that it is impossible to detect the phase shift with sufficient accuracy. As is shown in the art, resist is coated also on diffraction gratings 4-1 and 4-2 of wafer 1 before every X-ray exposure of the wafer during the manufacture of a semiconductor device. The resist layers coated on gratings 4-1 and 4-2 may have different thickness, as is often observed in the actual manufacture of the semiconductor device. In the case where the distance between gratings 4-1 and 4-2 is larger than the dimension of the gratings, there is a phase difference between the diffracted light beams which has passed through the resist layer coated on grating 4-1 and the light beams which has passed through the resist layer coated on grating 4-2. Consequently, the phase shift cannot be detected with a sufficiently high accuracy.

By contrast, in the first embodiment of the present invention, for example, the detection range of the displacement is inside $\pm 1.2$ $\mu$m, when the grating pitch Px is 15 $\mu$m. Hence, the preliminary aligning need not be performed as accurately as in the case of the aligning method shown in FIG. 6.

As has been described above, when the (0, r) order beams of the thrice diffracted beams are detected, the phase shift $\phi_A$ does not depend upon the gap z between wafer 12 and mask 13. In this case, the apparatus shown in FIG. 1 can align wafer 12 and mask 13 with a sufficiently high precision, regardless of the gap z between wafer 12 and mask 13.

In addition, it is sufficient to form only one diffraction grating on wafer 12. Even if the resist layer coated on single grating 16 is not uniform in thickness, the phase shift $\phi_A$ detected by phase meter 39 is accurate.

Figure 7:
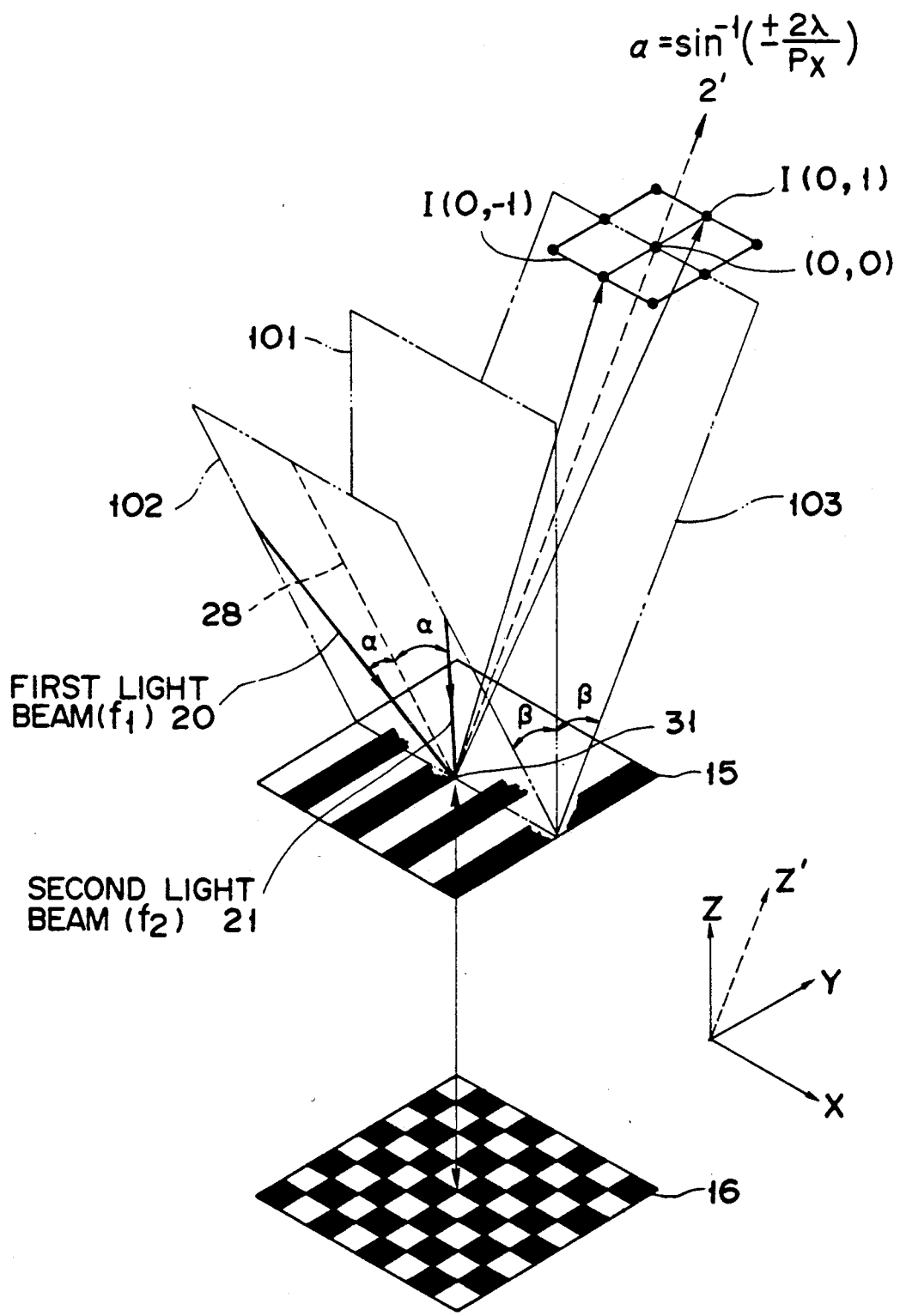
FIG. 7 is a diagram representing the two-dimensional distribution of the thrice diffracted light beam obtained when a light beam is applied to the diffraction grating of the mask obliquely to the y axis.

Further, first light beam 20 and second light beam 21 can be applied obliquely to the y-axis as is illustrated in FIG. 7. More precisely, first and second light beams 20 and 21 are applied to intersection 31 of first grating 15, the beams 20 and 21 extending in second plane 102, being symmetrical with respect to axis 28, and inclining to the axis at angle $\alpha$. Second plane 102 inclined at angle $\beta$ to first plane 101 which extends at right angles to the y axis. The axis 28 extends in the second plane 102 and at a right angle to the x axis. Intersection 31 is a point where axis 28 intersects with first grating 15.

In this case, the thrice light beams are distributed in two-dimensional fashion from align (0, 0) on the z' axis extending in third plane 103 and at right angles to the x axis. Third plane 103 is symmetrical to second plane 102 with respect to first plane 101. Hence, (0, $\pm$1) order beams are detected in this case, too.

Figure 8:
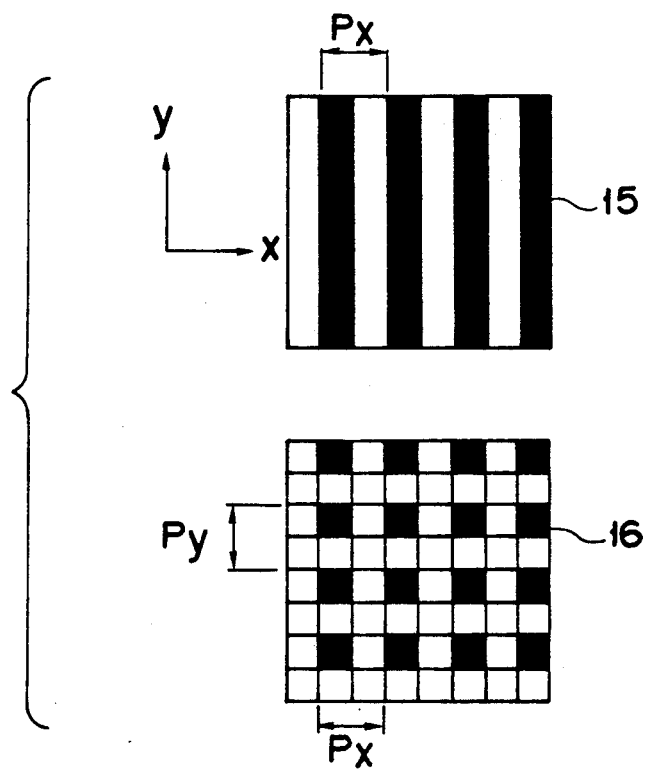
FIG. 8 shows the plan views of two other diffraction gratings which can be used in the apparatus shown in FIG. 1.

Second diffraction grating 16 can have such a pattern as is illustrated in FIG. 8. This is a two-dimensional pattern which consists of a first set of parallel stripes and a second set of parallel stripes which extend at right angles to the stripes of the first set when this second diffraction grating is used, phase shift $\phi_A$ does not depend upon the gap z between wafer 12 and mask 13.

The aligning method according t the first embodiment can apply to align a semiconductor wafer and a mask used in a reduced projection exposure apparatus, as is will be explained with reference to FIG. 9.

Figure 9:
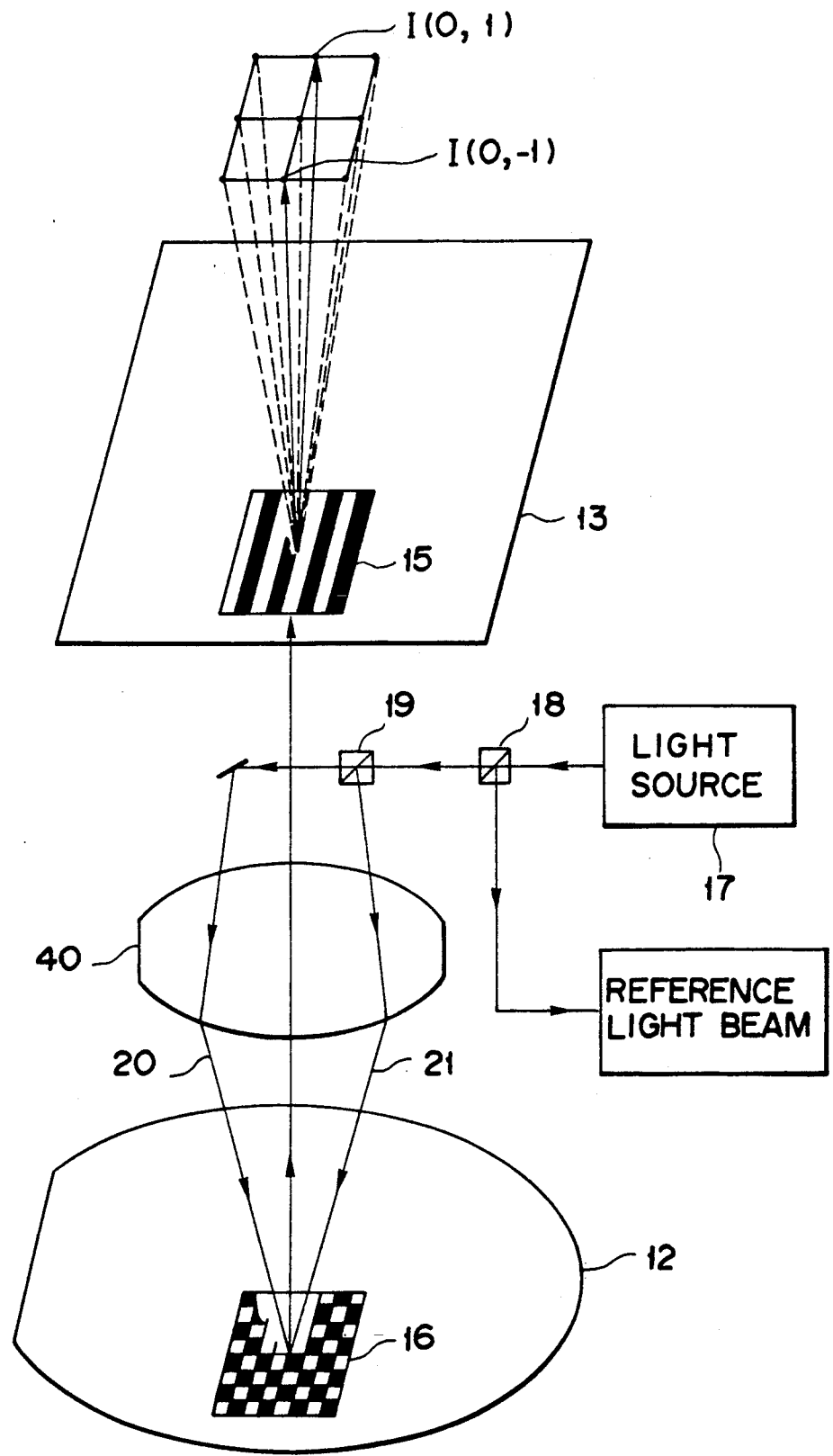
FIG. 9 schematically illustrates a modification of the apparatus shown in FIG. 1, designed to align, with respect to a wafer, a mask used in a reduced projection exposure apparatus.

As is shown in FIG. 9, lens 40 for reducing the image of a circuit pattern is interposed between semiconductor wafer 12 and X-ray exposure mask 13. First light beam 20 and second light beam 21, which have been obtained by splitting the beam emitted by laser 17, are applied through lens 40 onto second diffraction grating 16. Grating 16 reflects and diffracts the light beams. Once diffracted light beams are applied to first diffraction grating 15 formed on mask 13, and are changed to twice diffracted beams, the (0, $\pm$1) order beams of the twice diffracted light beams can be detected. The (0, $\pm$1) order beams have a phase shift $\phi_A$. Therefore, in this modification, it suffices to detect the specific order of twice diffracted light beams, in order to detect the displacement $\Delta x$ between wafer 12 and mask 13. That is, it is not necessary that the specific order beams of thrice diffracted light beams be detected.

Furthermore, in the first embodiment of the invention, the phase shift $\phi_A$ is detected, so that the mask and the wafer are appropriately aligned. Therefore, even if the permeability of first grating 15 or the reflectivity of second grating 16 changes, the phase shift $\phi_A$ does not vary at all. Hence, the S/N ratio of the signal output is not reduced as in the conventional apparatus, and the displacement Ax between wafer 12 and mask 13 can be detected more precisely than by the prior art apparatus.

A second embodiment of the invention, which is an apparatus for spacing a wafer and a mask apart from each other for a desired distance, will be described with reference to FIG. 10 through FIG. 14. The second embodiment also employs the optical heterodyne interference, and therefore uses the same optical reference signal-generating system and the same signal-detecting system, as are used in the first embodiment (FIG. 1). Only the features, which distinguish the second embodiment from the first embodiment, will be described, and how the second embodiment detects the gap between the wafer and the mask will be explained.

Figure 10:
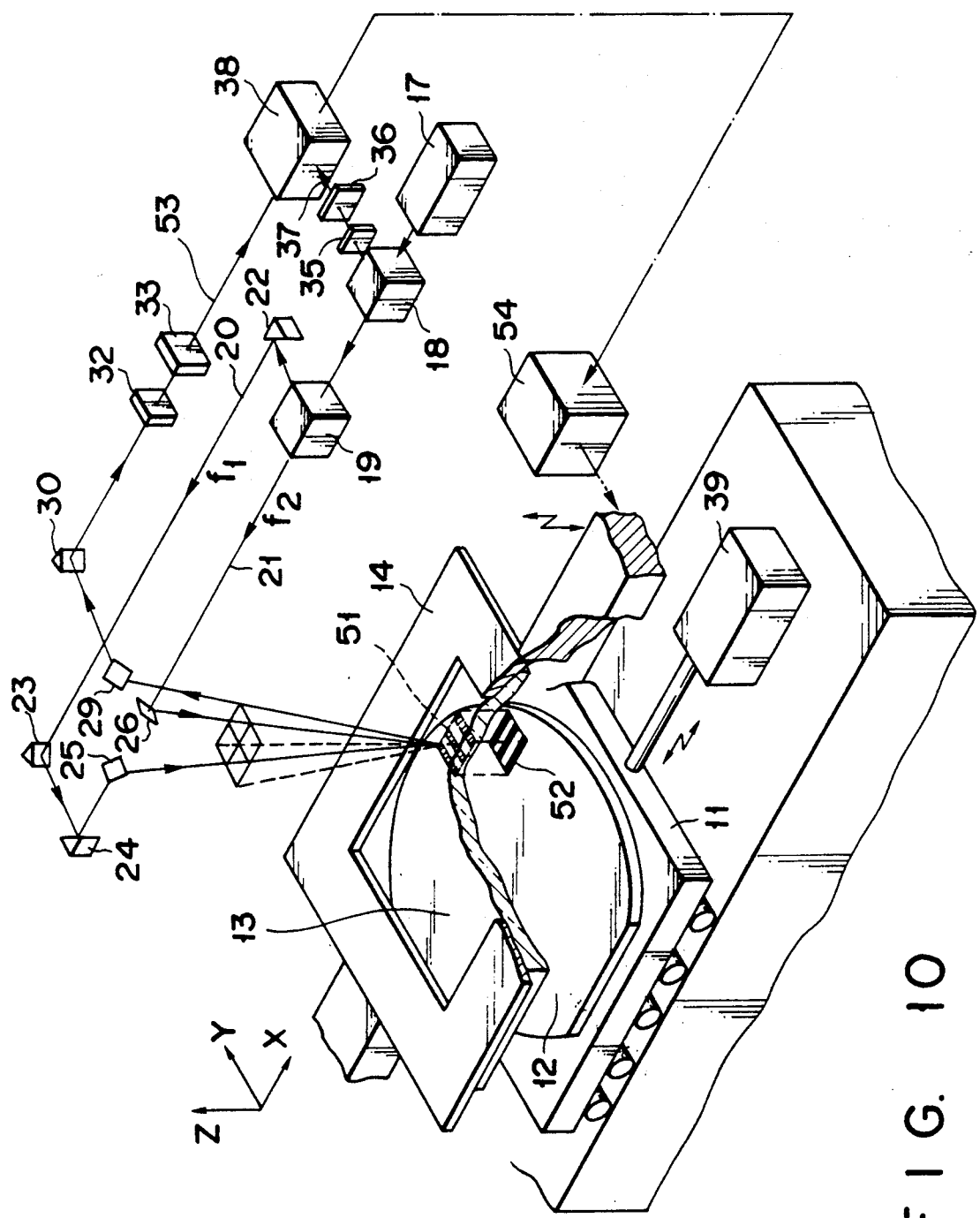
FIG. 10 is a perspective view showing an apparatus according to a second embodiment of the invention, which is designed to space an X-ray exposure mask apart from a semiconductor wafer for a desired distance.
Figure 11:
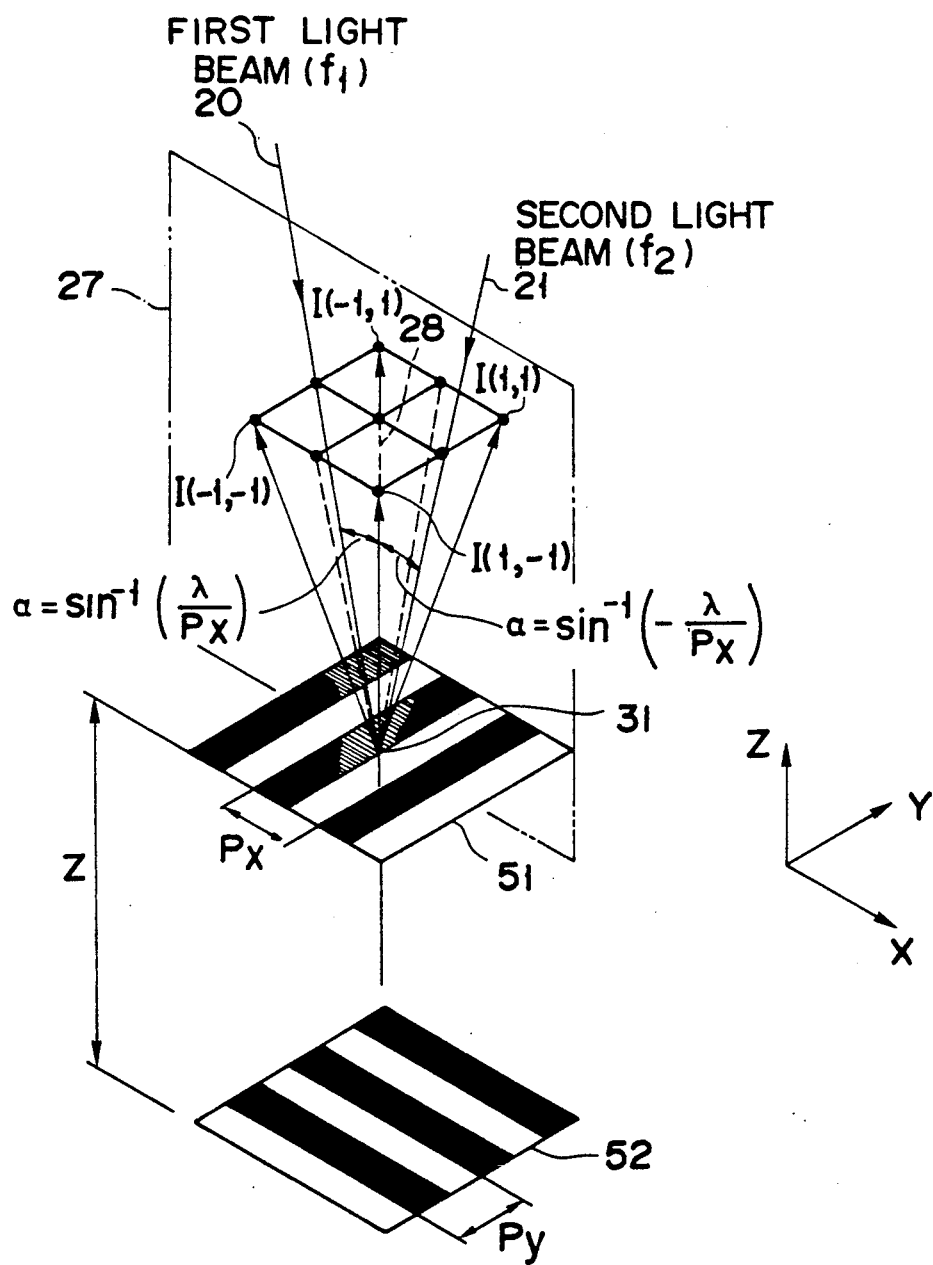
FIG. 11 is a diagram representing the two-dimensional distribution of the thrice diffracted light beam obtained when a light beam is applied to the diffraction grating of the mask perpendicular to the y axis.

As is illustrated in FIGS. 10 and 11, first diffraction grating 51 formed on mask 13 has a one-dimensional pattern consisting of parallel stripes which extend in the y axis and are set apart with equal pitch Px in the x axis. Second diffraction grating 52 formed on wafer 12 also has a one-dimensional pattern consisting of parallel stripes which extend in the x axis and are set apart with equal pitch Py in the y axis.

As has been clarified, the signal-detecting system is identical to that used in the first embodiment (FIG. 1). The third diffracted light beams having frequencies f1 and f2 emerge from first diffraction grating 51 when first and second light beams 20 and 21 are diffracted by first and second gratings 51 and 52 and simultaneously interfere with each other. Photosensor 33 converts ($\pm 1$, $\pm 1$) order beams of thrice diffracted light beams into a beat signal. The beat signal has phase shift $\phi_G$ representing the gap between mask 13 and wafer 12. The beat signal is input as detection signal 53 to phase meter 38, and reference signal 37 is also input to phase meter 38.

Phase meter 38 calculates the phase difference between detection signal 53 and reference signal 37, thus finding phase shift $\phi_G$. FIG. 12 shows the relationship between phase shift $\phi_G$ and the gap z between wafer 12 and mask 13. The gap z is changed to a desired value, so that the phase shift $\phi_G$ has a predetermined value. More precisely, the signal output by phase meter 38, which represents phase shift $\phi_G$, is supplied to wafer holder-driving device 54. In accordance with this signal, device 54 drives wafer mask holder 14 in the z axis, thereby moving mask 13 until phase shift $\phi_G$ becomes nil.

The apparatus shown in FIG. 10 can space mask 13 apart from wafer 12 with high precision, regardless of the displacement between wafer 12 and mask 13. In other words, the phase shift $\phi_G$ does not depends on the displacement between wafer 12 and mask 13, in the case $(1, \pm 1)$ order beams of thrice diffracted light beams is detected. The reason will be discussed below.

The order of diffraction in the x axis and the y axis is represented as (n, r). When a light beam having frequency f is applied to first grating 51 at incidence angle a, the (n, r) order beams of thrice diffracted light beams will be detected which has the intensity I(n, r). Intensity I(n, r) is given as follows:

$$I(n,r) \propto \left| \sum_{j=-\infty}^{+\infty} M^C K W^C(0,r) M^{C_1} \cdot \exp[-i\{2k^2 + (Px/Py)^2 r^2\}Z] \cdot \exp\{-i2k(2\pi/Px)z(\sin\alpha)\} \cdot \exp(i2\pi ft) \right|^2 \quad (8)$$

where $Z=\pi\lambda z/Rx^2$, Px is the pitch at which stripes of grating 52 are spaced apart in the x axis, Py is the pitch at which stripes of grating 52 are spaced apart in the y axis, z is the gap between wafer 12 and mask 13, $\lambda$ is the wavelength of the light beam, $M^C K$ is the k-order Fourier coefficient of first diffraction grating 51, and $W^C(0,r)$ is the (0, r)-order Fourier coefficient of second diffraction grating 52, and i is an imaginary number.

As is shown in FIG. 8, the first light beam 20 having frequency f1, and the second light beam 21 having frequency f2 are applied to first diffraction grating 51 and further to second diffraction grating 52, in the same way as in the first embodiment shown in FIG. 1, except that they are applied at different angles $\alpha = \sin^{-1}(\pm\lambda/Px)$. As a result, two thrice diffracted light beams having frequencies f1 and f2 are obtained. Of thrice diffracted light beams having frequency f1, the specific order beams which satisfy the conditions of $1+k_1+0+1_1+m_1=0=n_1$, $r_1=\pm 1$ and have intensities of $I(n_1, r_1)=I(1, \pm 1)$, are applied to photosensor 33. Similarly, of thrice diffracted light beams having frequency f2, the specific order beams which satisfy the conditions of $-1+k_2+0+1_2=1_2=n_2$, $r_2=\pm 1$ and have intensity of $I(n_2, r_2)=I(1, +1)$, are applied to photosensor 33. In other words, photosensor 33 receives the first-order beams of thrice diffracted beams having frequency f1 and f2 and emerging in the x axis, and also the $\pm 1$-order beams of thrice diffracted beams having frequency f1 and f2 and emerging in the y axis.

The order beams, which satisfy $k_1+1_1=0$ and $k_2+1_2=2$, are selected, and lower-order diffracted beams of $\pm$ third order or lower order are taken into consideration. The $(1, \pm 1)$ order beams of thrice diffraction light beams having frequencies f1 and f2 have the following complex amplitudes:

$$u_{f1} = \{(1/\pi)^3 e^{-\delta z} + (1/\pi)^3 e^{i2z} + \tfrac{1}{2} \cdot 1/\pi\} e^{i2\pi f_1 t} \quad (9)$$

$$u_{f2} = (1/\pi)^3 e^{i2z} \cdot e^{i2\pi f_2 t} \quad (10)$$

From complex amplitude $u_{f1}$ and $u_{f2}$, intensity $I(1, \pm 1) (= |u_{f1}+u_{f2}|)$ is computed as follows:

$$I(1, \pm 1) \propto 2(1/\pi)^6 \cos(2\pi\Delta ft + 8z) + 2(1/\pi)^6 \cos(2\pi\Delta ft) + \tfrac{1}{2}(1/\pi)^4 \cos(2\pi\Delta ft + 2z) \quad (11)$$

where $\Delta f = |f1+f2|$, and t is time.

Equation (11) can be rewritten into:

$$I(1, \pm 1) \propto \{2(1/\pi)^6 \cos 8z + 2(1/\pi)^6 + \quad (12)$$

$$\tfrac{1}{2}(1/\pi)^4 \cos 2z\}\cos(2\pi\Delta ft) - \{2(1/\pi)^6 \sin 8z +$$

$$\tfrac{1}{2}(1/\pi)^4 \sin 2z\} \cdot \sin(2\pi\Delta ft) = \sqrt{A^2 + B^2} \, \cos(2\pi\Delta ft - \phi_G)$$

where A, B, and $\phi_G$ are given as follows:

$$A = 2(1/\pi)^6 \sin 8z + \tfrac{1}{2}(1/\pi)^4 \sin 2z \quad (13)$$
$$B = 2(1/\pi)^6 \cos 8z + 2(1/\pi)^6 + \tfrac{1}{2}(1/\pi)^4 \cos 2z \quad (14)$$
$$\phi_G = \tan^{-1}(A/B) \quad (15)$$

As can be understood from equations (12) to (15), the intensity I(0,1) of the thrice diffracted beams is represented by the beat signal having frequency $\Delta f$ $(=|f1+f2|)$. The beat signal also has the phase shift $\phi_G$. This phase shift $\phi_G$ is identical with the phase difference between the intensity I(0, $\pm 1$) and the intensity of the reference signal, i.e., $I = a\cos|2\pi(f2-f1)t|$ (where a is a constant not 0). Obviously, the phase shift $\phi_G$ changes with the gap z between wafer 12 and mask 13, and does not depend on the displacement $\Delta x$ between wafer 12 and mask 13. Hence, the apparatus shown in FIG. 10 can space mask 12 apart from wafer 12 for a desired distance, regardless of the displacement between the mask and the wafer.

The relationship between the gap z and the phase shift $\phi_G$ given by equation (15), can be illustrated as in FIG. 12. Pitch Px at which the stripes of first grating 51 is 4.4 $\mu$m. As is evident from FIG. 12, the detection range of the gap is relatively broad, i.e., $\pm 10$ $\mu$m. Thus, the apparatus can set the gap z to the target value, i.e., 30 $\mu$m, only if wafer 12 and mask 13 have been preliminarily spaced apart for a distance 30$\pm$10 $\mu$m. The preliminarily gap setting need not be so precisely performed as in the case of the conventional apparatus.

According to the invention, it is not the intensity of diffracted light beams, but the phases of these beams that are measured. During the manufacture of LSIs, the intensity I(1, $\pm 1$) of each diffracted light beam varies, but the phase thereof does not change. Therefore, the apparatus (FIG. 10) can accurately detect the gap z from the phase shift $\phi_G$. Thus, the gap between mask 13 and wafer 12 can be set for the desired distance, precisely.

As has been described above, the phase shift $\phi_G$ is detected from the $(1, \pm 1)$ order beams of the diffracted light beams. The phase shift $\phi_G$ can also be accurately detected also from the (n, $\pm 1$) order beams of the diffracted light beams, where n is an integer.

Figure 13:
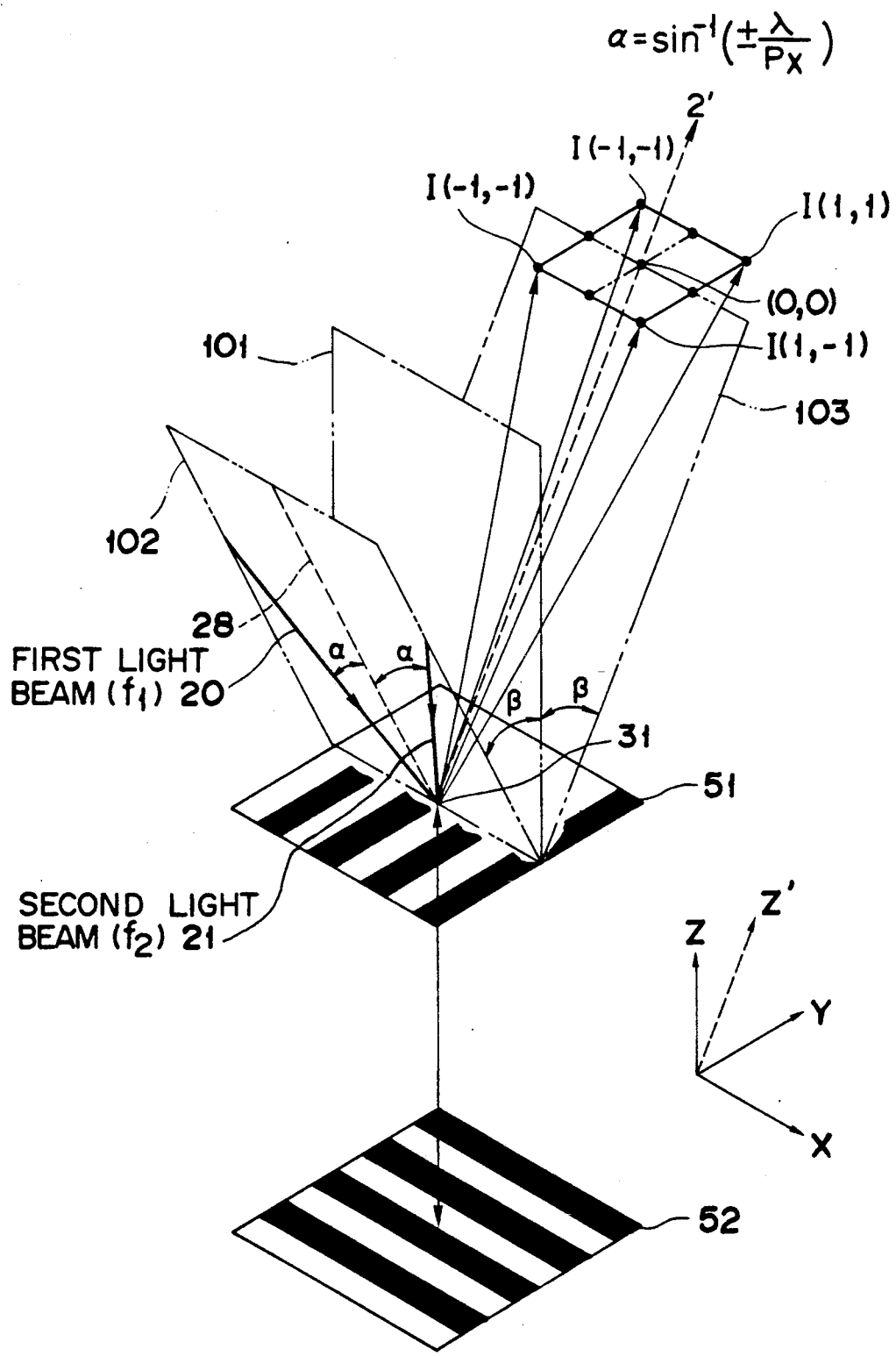
FIG. 13 is a diagram representing the two-dimensional distribution of a thrice diffracted light beam obtained when a light beam is applied obliquely to the y axis.

Further, first light beam 20 and second light beam 21 can be applied to first diffraction grating 51 obliquely with respect to the y axis, as is shown in FIG. 13 and as in the case of the first embodiment (FIG. 1).

Still further, second diffraction grating 52 can have such a two-dimensional pattern as is illustrated in FIG. 8. In this case, too, the specific order beams of the diffracted light beams contain phase shift $\phi_G$ which is not dependant upon the displacement between wafer 12 and mask 13.

Figure 14:
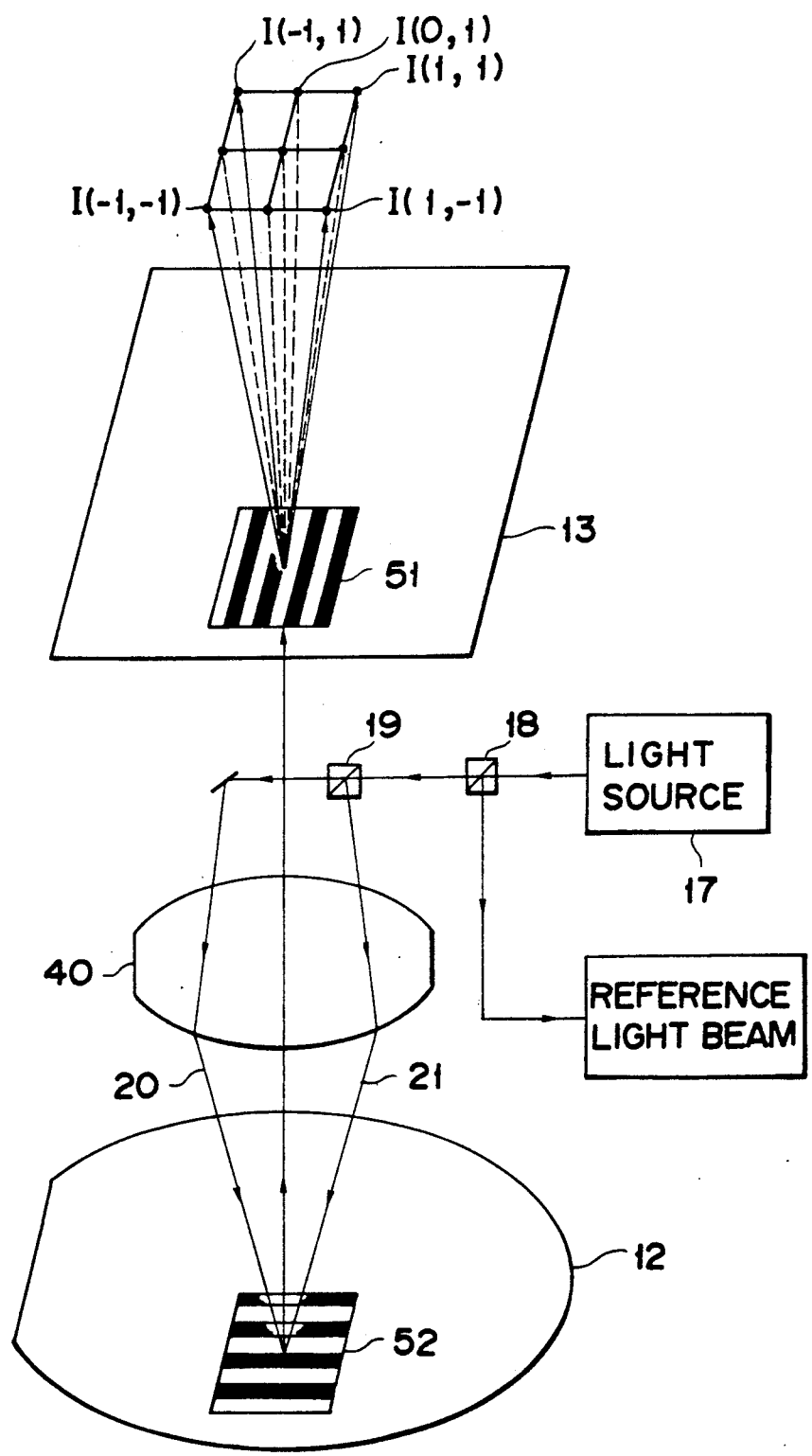
FIG. 14 schematically illustrates a modification of the second embodiment, designed to align, with respect to a wafer, a mask used in a reduced projection exposure apparatus.

Furthermore, the method according to the second embodiment of the invention, can apply to set a desired gap between a wafer and a mask, as is shown in FIG. 14, in a reduced projection exposure apparatus.

Moreover, the two twice diffracted light beams having frequencies f1 and f2 emerge in the same way as is shown in FIG. 9, since first and second beams 20 and 21 have been applied from second diffraction grating 52 to first diffraction grating 51. The (1, 1) order beams of the twice diffracted light beams contain the phase shift $\phi_G$ which does not depend on the displacement between wafer 12 and mask 13. Hence, in this modification shown in FIG. 14, it is unnecessary to detect specific order beams thrice diffracted light beams; it suffices to detect specific order beams of two twice diffracted light beams, in order to determine the gap z correctly.

A third embodiment of the invention will be now described, with reference to FIGS. 15 to 20. This embodiment is an apparatus designed not only for aligning a wafer and a mask, but also for spacing apart the wafer and the mask for a desired distance. Basically the third embodiment is a combination of the first embodiment (FIG. 1) and the second embodiment (FIG. 10). Light beams 20 and 21 are incident on first diffraction grating 71 formed on mask 13 at angle $\alpha$ $(=\pm 2\lambda/Px)$, respectively. Light beams 20 and 21, thus applied onto first grating 71 are used not only for aligning wafer 12 and mask 13, but also for spacing apart wafer 12 and mask 13 for a desired distance. Therefore, the signal-detecting system used in the third embodiment is less complex than an identical combination of the two detecting systems incorporated in the first embodiment (FIG. 1) and the second embodiment (FIG. 10).

Figure 16:
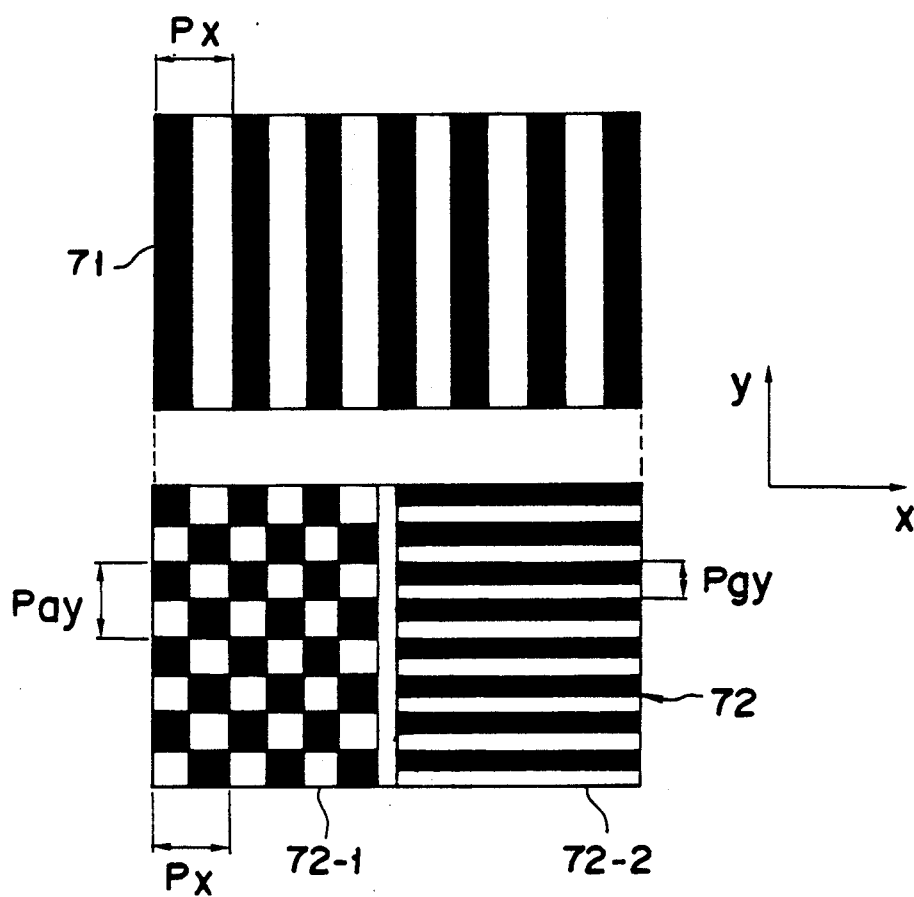
FIG. 16 shows the plan views of two other diffraction gratings which can be used in the apparatus shown in FIG. 15.

First diffraction grating 71 and second diffraction grating 72 have the patterns shown in FIG. 16. Grating 71 permeates and diffracts the light applied to it. Like the first grating used in the first and second embodiments, grating 71 has a one-dimensional pattern which consists of parallel stripes extending in the y axis and arranged at equal pitch Px in the x axis. Second grating 72, which is formed on wafer 12, reflects and diffracts the light applied to it. Its pattern consists of two rectangular parts 72-1 and 72-2. Part 72-1 is a checkered pattern designed to align wafer 12 and mask 13; it consists of a plurality of squares arranged at equal pitch Pay in the y axis and at equal pitch Px in the x axis. Part 72-2 is a one-dimensional pattern designed to space apart wafer 12 and mask 13 for a desired distance; it consists of parallel stripes extending in the x axis and arranged at equal pitch Pgy in the y axis. Pitch Pay is different from pitch Pgy. Pay may be equal to Pay.

Figure 15:
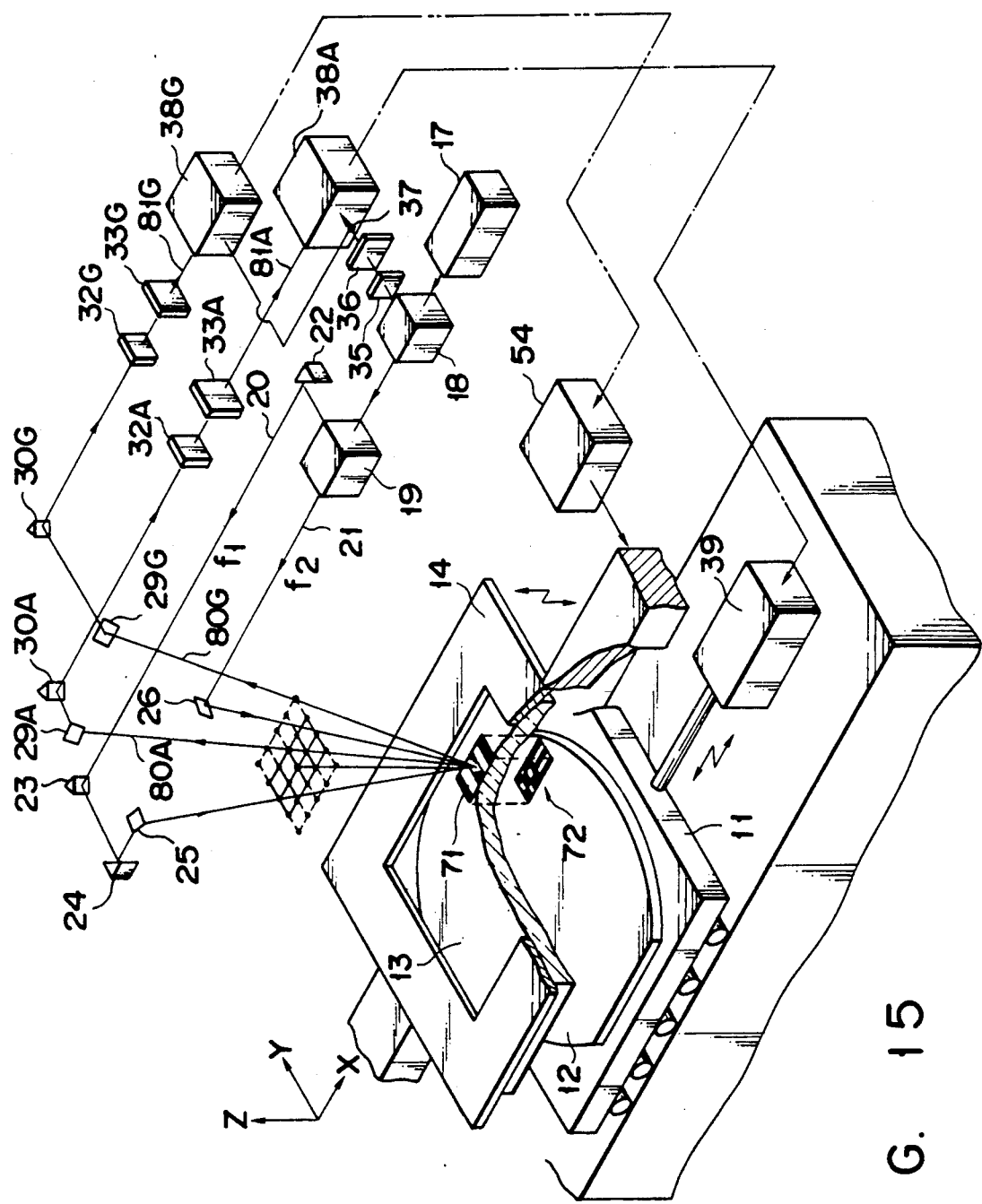
FIG. 15 is a perspective view showing an apparatus according to a third embodiment of the invention, which is designed to align an X-ray exposure mask and a semiconductor wafer and also to space the X-ray exposure mask apart from the semiconductor wafer for a desired distance.
Figure 17:
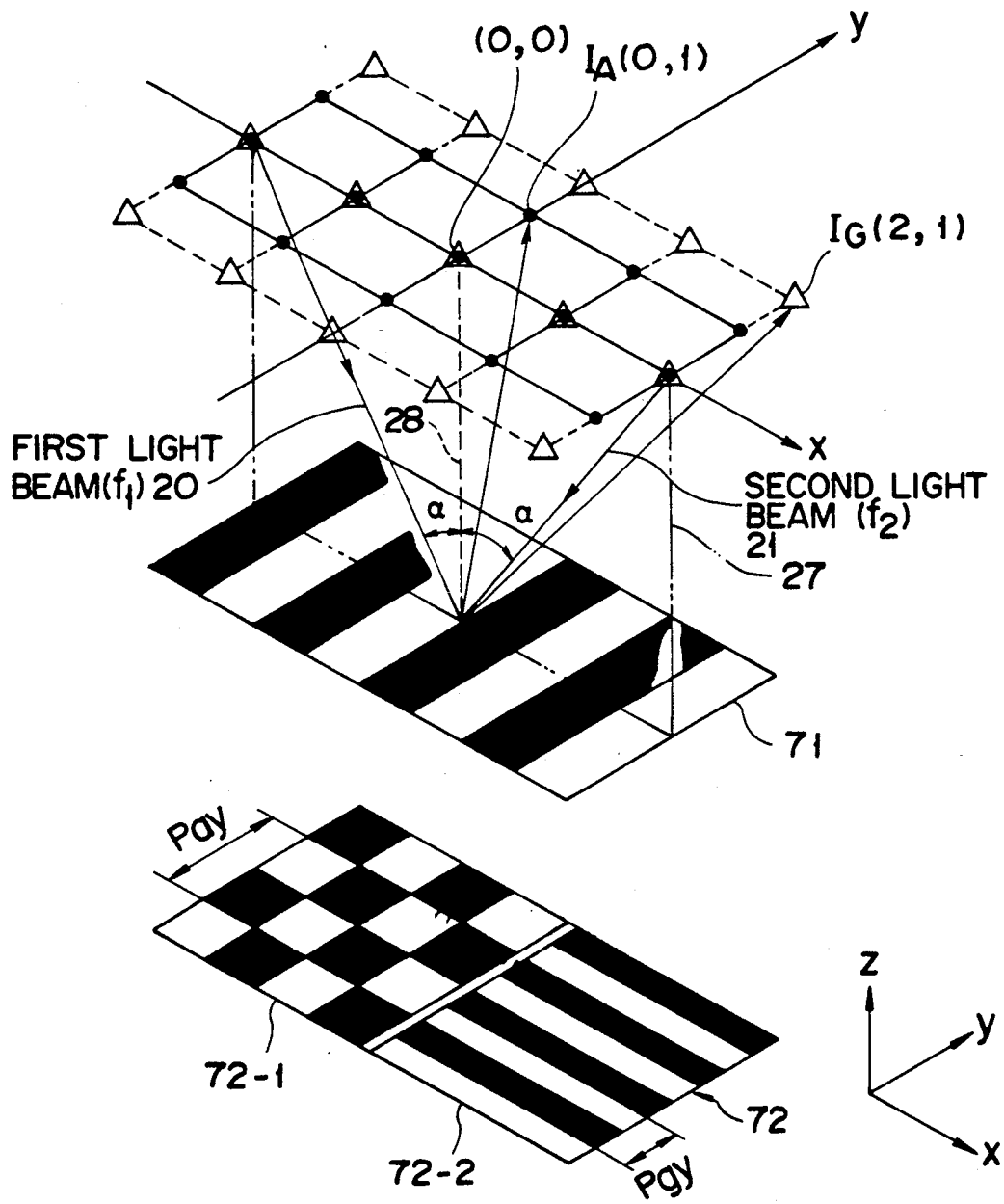
FIG. 17 is a diagram representing the two-dimensional distribution of the thrice diffracted light beam obtained when a light beam is applied to the diffraction grating of the mask perpendicular to the y axis.

As has been pointed out and as is shown in FIGS. 15 and 17, light beams 20 and 21, which have been emitted from beam splitter 19 and have frequencies f1 and f2, are incident on first diffraction grating 71 formed on mask 13 at angle $\alpha(=\pm 2\lambda/Px)$, respectively. Light beams 20 and 21 are converted into once diffracted light beams as they pass through first diffraction grating 17. Part 72-1 of second diffraction grating 72 reflects and diffracts part of either once diffracted beams, thus converging the same into twice diffracted light beams. The twice diffracted beams, thus emerging from part 72-1 of second diffraction grating 72, are diffracted by first diffraction grating 71 and converted into thrice diffracted light beams having frequencies f1 and f2. These thrice diffracted beams are distributed in both the x axis and the y axis as is indicated by the dots (.) shown in FIG. 17. I(0, 1) order two light beams of either thrice diffracted light beams contain phase shift $\phi_A$ which is proportional to the displacement between wafer 12 and mask 13. The two light beams of $I_A(0, 1)$ order are transferred to photosensor 33A, as displacement detection light beams 80A.

In the first and second embodiments, the order of the diffracted light beams is represented as (n, r). In the third embodiment (FIG. 15), the order of the diffracted light beams serving for aligning wafer 12 and mask 13 is identified as $I_A(n, r)$, and that of the diffracted light beams serving for spacing wafer 12 and mask 13 for a desired distance is given as $I_G(n, r)$.

Meanwhile, the one-dimensional pattern 72-2 of second diffraction grating 72 reflects and diffracts the remaining part of either once diffracted beams emerging from first diffraction grating 71, into twice diffracted light beams. Hence, twice diffracted light beams emerge from part 72-2 of second grating 72. These twice diffracted light beams are applied to first grating 71. Grating 71 converts the twice diffracted light beams into two thrice diffracted light beams having frequencies f1 and f2. These thrice diffracted beams are distributed in both the x axis and the y axis as is indicated by the small triangles (▲) shown in FIG. 17. The $I_G(2, 1)$ order two light beams of thrice diffracted light beams contain phase shift $\phi G$ which is proportional to the gap between wafer 12 and mask 13. The two light beams of $I_G(2, 1)$ order are transferred to photosensor 33G, as gap detection light beams 80G.

As can be seen from FIG. 17, the thrice diffracted light beams emerging from checkered pattern 72-1 are distributed to some positions in the y axis, and the thrice diffracted light beams emerging from one-dimensional pattern 62-2 are distributed to different positions in the y axis. This is because pitch Pay, at which the squares of pattern 72-1 are arranged in the y axis, is different from pitch Pgy at which the stripes 15 of pattern 72-2 are arranged in the y axis.

Photosensor 33A converts displacement detection light beams 80A representing the displacement between wafer 12 and mask 13, into a beat signal or detection signal 81A having a frequency $\Delta f$ $(= |f_2 - f_1|)$. Detection signal 81A, which has phase shift $\phi A$ which corresponds to the displacement between wafer 12 and mask 13, is supplied to phase meter 38A. Reference signal 37 output by photosensor 36 is also supplied to phase meter 38A. Phase meter 38A detects the phase difference between detection signal 81A and reference signal 37, i.e., phase shift $\phi A$ which will be used to align wafer 12 and mask 13 appropriately.

Similarly, photosensor 33G converts gap detection light beams 80G representing the gap between wafer 12 and mask 13, into a beat signal or detection signal 81G having a frequency $\Delta f$ $(= |f_2 - f_1|)$. Detection signal 81G, which has phase shift $\phi_G$ which corresponds to the gap between wafer 12 and mask 13, is supplied to phase meter 38G. Reference signal 37 output by photosensor 36 is also supplied to phase meter 38G. Phase meter 38G detects the phase difference between detection signal 81G and reference signal 37, i.e., phase shift $\phi_G$ which will be used to adjust the gap between 12 and mask 13 to a desired value.

The signal output by phase meter 38A, which represents phase shift $\phi_A$, i.e., the displacement between wafer 12 and mask 13, is supplied to table-driving device 39. The signal output by phase meter 38G, which represents phase shift $\phi_G$, i.e., the gap between wafer 12 and mask 13, is supplied to holder-driving device 54. Device 39 drives wafer table 11 in accordance with the signal supplied from phase meter 38A, thereby moving wafer 12 in the x axis and thus properly aligning it with respect to mask 13. Device 54 drives mask holder 14 in accordance with the signal supplied from phase meter 38G, thus moving mask 13 in the z axis and thus adjusting the gap between wafer 12 and mask 13 to the desired value.

Even if two light beams of $I_G(2, 1)$ order is detected and incident angle $\alpha = \sin^{-1}(\pm 2\lambda/Px)$, $I_G(2, 1)$ order beams changes with the gap z between the mask and the wafer, and does not depend on the displacement $\Delta x$ therebetween. The reason will be discussed below.

Each light beam of the $I_G(2, 1)$ order is a composite light comprised of light beams having frequencies f1 and f2. The complex amplitude of the $I_G(2, 1)$-order light beam having frequency f1 and the complex amplitude of the $I_G(2, 1)$-order light beam having frequency f2 are given as follows, in consideration of the diffraction order of first grating 71 and also the diffraction order of the one-dimensional pattern 72-2 of second grating 71:

$$u'_{f1'} = 1/18(1/\pi)^3 e^{i50z} + \tfrac{1}{2}(1/\pi)^3 e^{i18z} + \quad (16)$$

$$u'_{f2} = -\tfrac{1}{2}(1/\pi)^3 e^{i2z} \quad 1/18(1/\pi)e^{i8z}\{1/18(1/\pi)^3\tfrac{1}{2}(1/\pi)3\}e^{i2z} \quad (17)$$

From complex amplitudes $u'_{f1}$, and $u'_{f2}$, the intensity $I_G(2, 1)$ $(= |u'_{f1} - u'_{f2}|^2)$ is computed as follows:

$$I'(\pm 2, \pm 1) \propto \sqrt{C^2 + D^2} \cos(2\pi \Delta ft - \phi_G) \quad (18)$$

where $$C = -\{1/9(1/\pi)2\sin 48z + (1/\pi)^2 \sin 16z + \tfrac{1}{2}\sin 6z\} \quad (19)$$
$$D = -\{1/9(1/\pi)^2\cos 48z + (1/\pi)^2\cos 16z + \tfrac{1}{2}\cos 6z + 10/9(1/\pi)^2 \quad (20)$$

$$\phi_G = \tan^{-1}(C/D) \quad (21)$$

As can be understood from equations (19) to (21), the intensity $I_G(2, 1)$ is that of the beat signal having frequency $\Delta f (= |f_2 - f_1|)$. The phase shift $\phi_G$ of this signal represents only the gap between wafer 12 and mask 13; it does not represent the displacement between wafer 12 and mask 13. Therefore, the apparatus shown in FIG. 15 can adjust the gap between wafer 12 and mask 13, irrespective of the displacement therebetween. In addition, the apparatus can align wafer 12 with respect to mask 13 with high precision, regardless of the gap between wafer 12 and mask 13, provided that photosensor 33A detects light beams of the $I_A(0, \pm 1)$ order as in the first embodiment (FIG. 1).

Therefore, the apparatus of the third embodiment (FIG. 15) can perform the aligning of wafer 12 and mask 13 and the adjusting of the gap therebetween, independently of each other. As has been pointed out, light beams 20 and 21, which are incident on first diffraction grating 71 at angle $\Delta$ $(=\pm 2\lambda/Px)$, respectively, are used not only for aligning wafer 12 and mask 13, but also for spacing apart wafer 12 and mask 13 for a desired distance, and the signal-detecting system is less complex than a combination of two detecting systems identical to the systems incorporated in the first embodiment (FIG. 1) and the second embodiment (FIG. 10).

Figure 18:
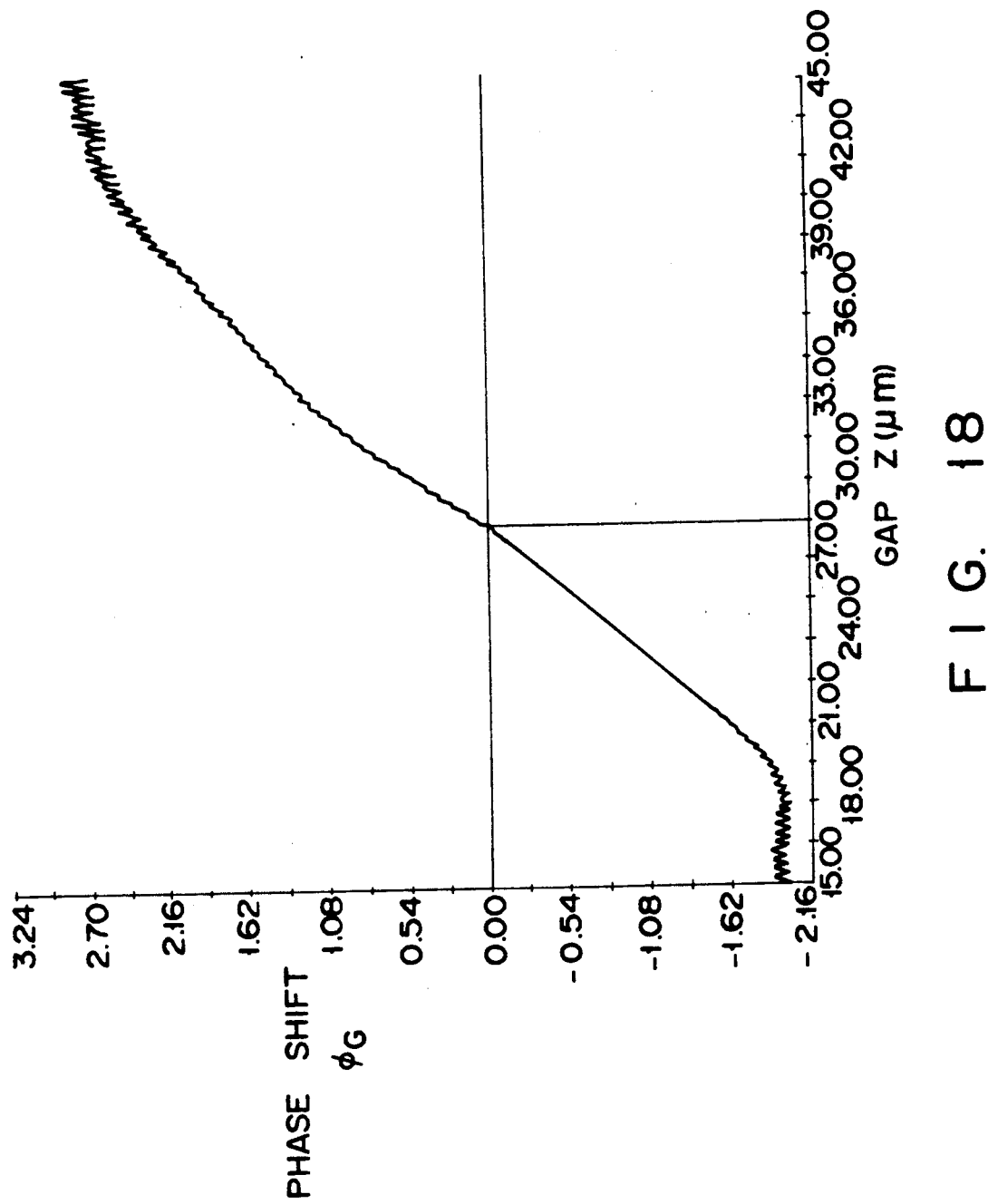
FIG. 18 is a graph illustrating the relationship between the gap between the mask and the wafer and the phase shift of the thrice diffracted light beam.

FIG. 18 illustrates the relationship between phase shift $\phi_G$ and gap z, which is observed when two light beams of the $I_G(2, 1)$ order are detected and Px is 10 $\mu$m. As can be understood from FIG. 18, the gap detection range is $\pm 15$ $\mu$m and is broader than in the case where $I_G(1, 1)$ order beams are detected. Thus, the apparatus can set the gap z to the target value, i.e., 30 $\mu$m, only if wafer 12 and mask 13 have been preliminarily spaced apart for a distance $30 \pm 15$ $\mu$m. The preliminarily gap setting need not be so precisely performed as in the case where the detected light beams are of the $I_G(1, 1)$ order.

When the detected light beams are of the $I_A(O, r)$ order, the apparatus can position wafer 12 and mask 13 appropriately; however great or small the gap z. Further, when the detected light beams are of the $I_G(n, \pm 1)$ order, the apparatus can adjust the gap z to a desired value regardless of the displacement between wafer 12 and mask 13.

Figure 19:
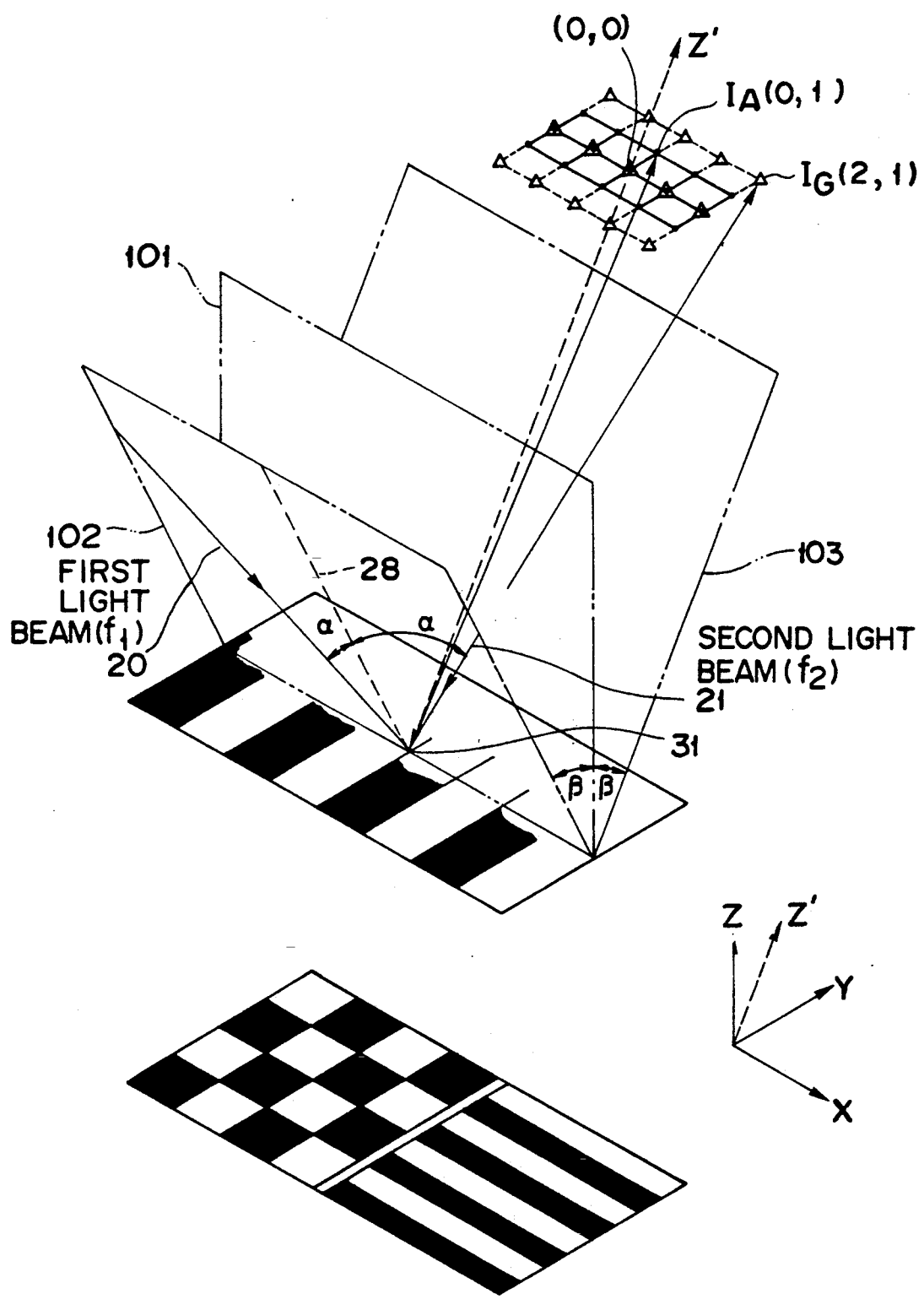
FIG. 19 is a diagram representing the two-dimensional distribution of a thrice diffracted light beam obtained when a light beam is applied obliquely to the y axis.

Needless to say, first light beam 20 and second light beam 21 can be applied to first diffraction grating 71 obliquely with respect to the y axis, as is shown in FIG. 19. In this case, the thrice diffracted light beams are distributed from origin (0, 0) which exists on the z' axis extending in third virtual plane 103.

Figure 20:
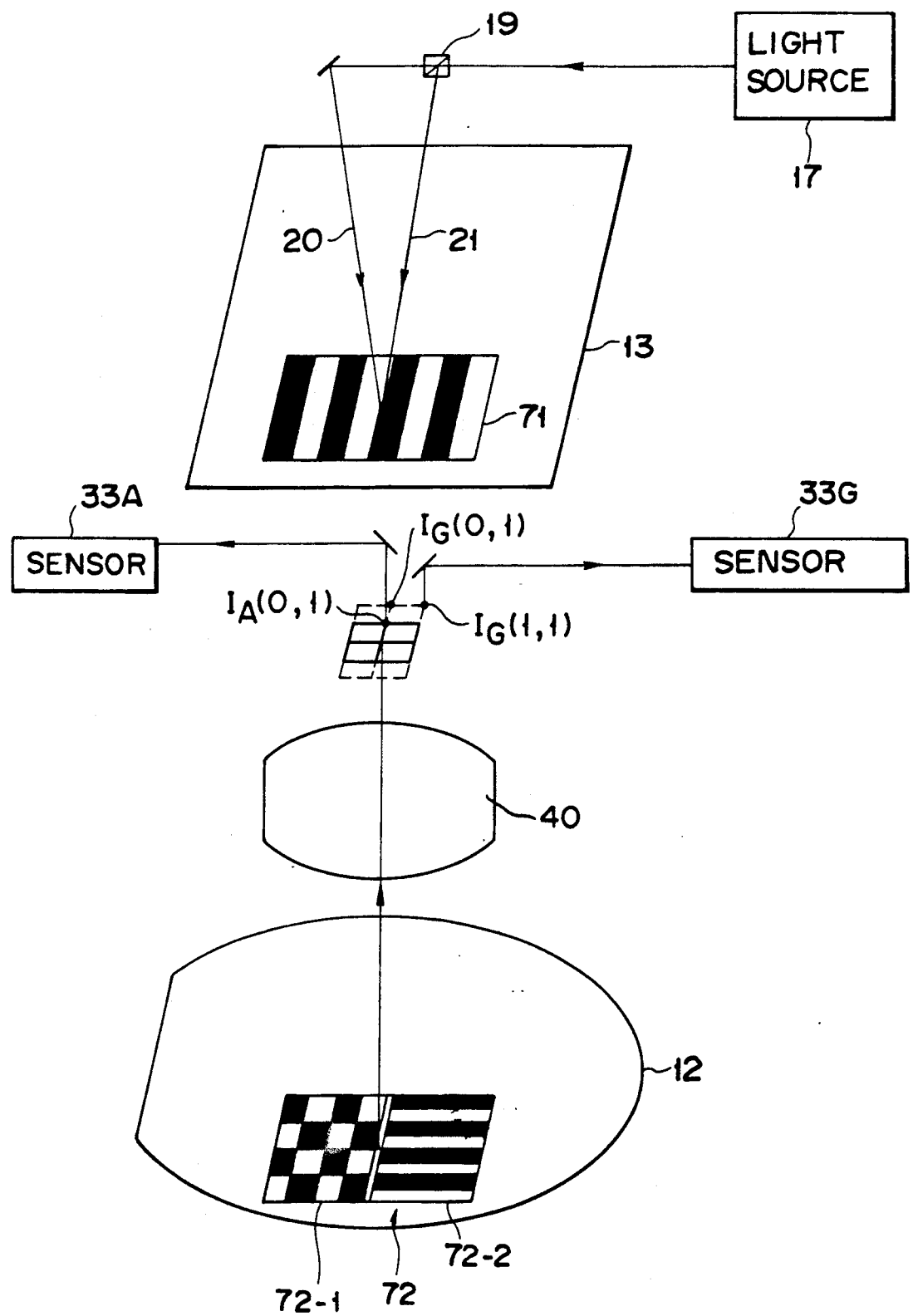
FIG. 20 schematically illustrates a modification of the third embodiment, designed to align, with respect to a wafer, a mask used in a reduced projection exposure apparatus and also to space the mask apart from the wafer for a desired distance.

Further, the third embodiment of the invention can be used in a reduced projection exposure apparatus as is shown in FIG. 20. First light beam 20 and second light beam 21 are applied to first diffraction grating 71. They are diffracted by grating 71 as they pass through this grating, thus forming once diffracted light beams. The once diffracted light beams are applied via projection lens 40 onto second diffraction grating 72. The first once diffracted beams are reflected and diffracted by the checkered pattern 72-1 of grating 72, and the second once diffracted beams are reflected and diffracted by the one-dimensional pattern 72-2 of grating 72. As a result, first and second two twice diffracted beams emerge from checkered pattern 72-1 and one-dimensional pattern 72-2 respectively. The $I_A(0, 1)$ order beams of the first twice diffracted beams, pass through projection lens 40, are reflected by a mirror, and are supplied to photosensor 33A. The $I_G(1, 1)$ order beams of the second twice diffracted beam passes through projection lens 40, are reflected by a mirror, and are supplied to photosensor 33G. The $I_A(0, 1)$ order beams has phase shift $\phi_A$, whereas the $I_G(1, 1)$ order beams has phase shift $\phi_G$.

In this case, too, light beams 20 and 21, which have been obtained by splitting a single light beam emitted by one light source, are used not only for aligning wafer 12 and mask 13, but also for spacing apart wafer 12 and mask 13 for a desired distance. Further, as in the modifications (FIG. 9 and FIG. 14) of the first and second embodiments, it suffices to detect the specific order beams at least twice diffracted light beams.

A fourth to a sixth embodiment will now be explained.

In the first to third embodiments, the light beam emitted by laser 17 is split into two components. One component is applied, as a reference beam, via deflection plate 35 to photosensor 36. The other component is applied, as a detection beam, to deflection beam splitter 19. Beam splitter 19 splits the detection beam into two light beams 20 and 21. Both detection beams 20 and 21 are diffracted by the diffraction grating formed on mask 13 and also by the diffraction grating formed on wafer 12, and are finally detected by two photosensors, respectively.

Obviously, detection beams 20 and 21 travel a far longer way than the reference beam applied from beam splitter 18 to photosensor 36. Therefore, the detection beams have a great chance of being influenced by disturbances, such as convection, to have their phases altered. By contrast, the reference beam is scarcely affected by such disturbances, and its phase is little altered.

The reference light beam may travel a longer way than detection beams 20 and 21, unlike in the first to third embodiments. If this is the case, the reference beam has a great chance of being influenced by disturbances and to have its phase altered.

In either case, the phase shift $\phi$ detected by phase meter 38, i.e., the phase difference between the reference beam and either diffracted detection beam, represents the sum of the phase shift representing the displacement or gap between wafer 12 and mask 13, and the phase shift which either detection beam or the reference beam has undergone while travelling until it reaches photosensor 33 (or 33A or 33G) or photosensor 36. In other words, the phase shift $\phi$ does not correctly represent the displacement or gap between wafer 12 and mask 13. Consequently, neither the displacement nor the gap can be detected with a great precision.

Now, with reference to FIGS. 21 to 28, a fourth, a fifth, and a sixth embodiment of the invention will be described, which are designed to detect the displacement between a wafer and a mask and also the gap between them, more accurately than the first to third embodiments even if the reference light beam, or either detection light beam, or both have been influenced by disturbances such as convection.

First, the fourth embodiment designed to align a wafer with respect to an X-ray exposure mask will be described with reference to FIGS. 21 to 24. The fourth embodiment is a modification of the first embodiment. This embodiment is different from the first in that those components of light beams 20 and 21, which have been reflected by first diffraction grating 15, are used as reference light beams. These reflected components of light beams 20 and 21 are, of course, in phase with beams 20 and 21 and, hence, represent neither the displacement between wafer 12 and mask 13 nor the gap between them.

Figure 22:
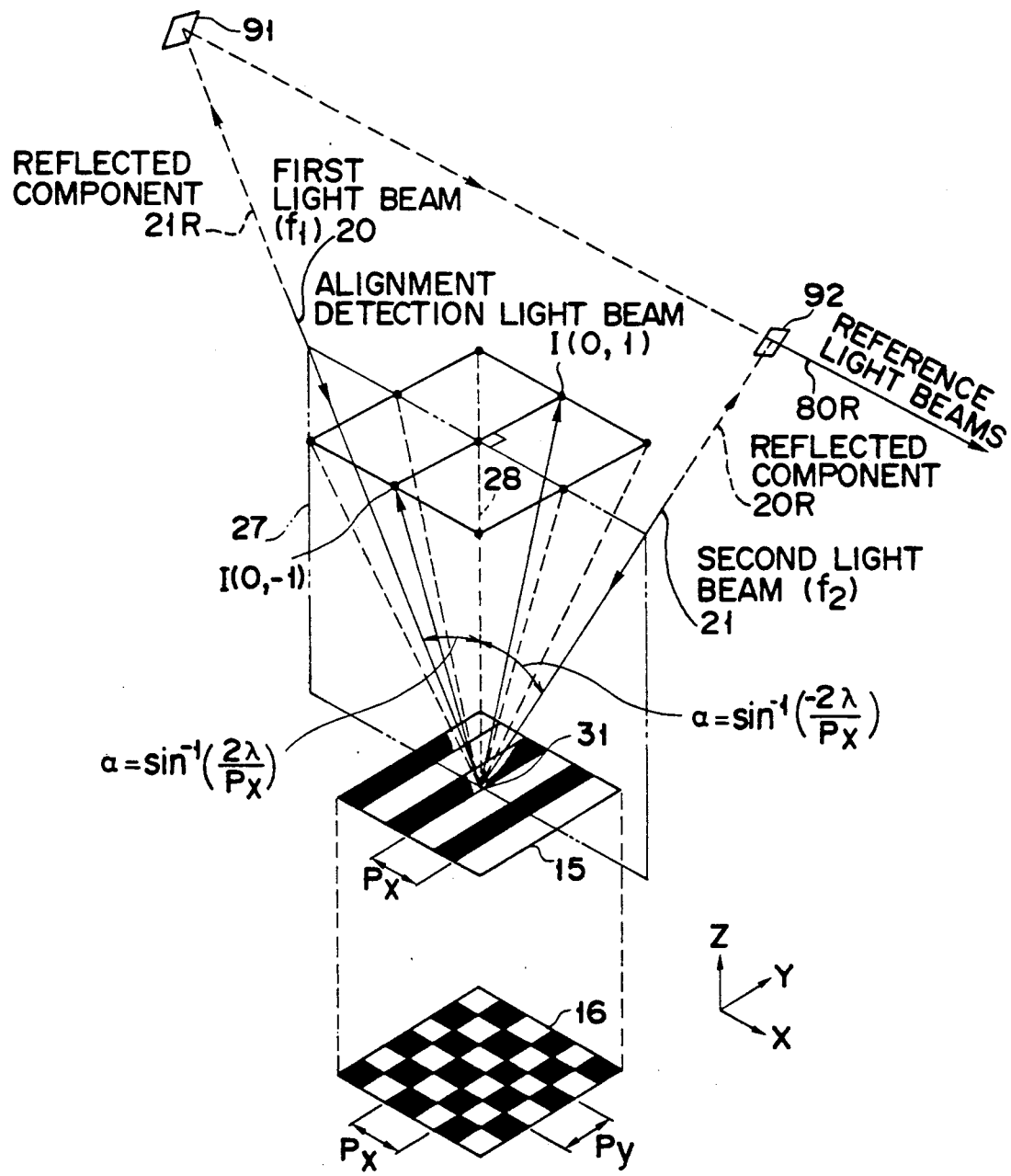
FIG. 22 is a diagram representing the two-dimensional distribution of the thrice diffracted light beam obtained when a light beam is applied to the diffraction grating of the mask perpendicular to the y axis.

More specifically, as is shown in FIG. 22, first light beam 20 is applied to first diffraction grating 15 at angle $\alpha$ ($=\sin^{-1}(2\lambda/Px)$) to axis 28. That component 20R of this beam, which is reflected by grating 15 and is of the 0th order, is applied at angle $\alpha$ ($=\sin^{-1}(-2\lambda/Px)$) to axis 28. Hence, this component 20R travels in the path of second light beam 21, in the opposite direction. In the mean time, second light beam 21 is also applied to grating 15 at angle $\Delta$ ($=-\sin^{-1}(-2\lambda/Px)$) to axis 28. That component 21R of this beam, which is reflected by grating 15 and is of the 0th order, is applied at angle $\alpha$ ($=\sin^{-1}(2\lambda/Px)$) to axis 28. Thus, this component 21R travels in the path of first light beam 20, in the opposite direction. Components 20R and 21R are reflected by mirrors 91 and 92 such that they interfere with each other, thereby forming reference light beam 80R. Reference light beam SOR is applied to photosensor 36. Photosensor 36 converts beam 80R into a beat signal, i.e., reference signal 37.

In the first embodiment (FIG. 1), beam splitter 18 splits the beam emitted from laser 17 into a detection beam and a reference beam. The paths in which these beams travel from splitter 18 to sensor 36 are quite different in both position and length. In the fourth embodiment (FIG. 21), splitter 19 splits the beam from laser 17 into the first light beam f1 and the second light beam f2. First and second light beams 20 and 21 are divided into the detection beam and the reference beam (i.e., reflected beam), after light beams 20 and 21 are applied to first grating 15. The path of a light beam which will be changed to the detection light beam, is substantially identical to the path of a light beam which will be changed to the reference light beam, in both portion and length.

In addition, the path in which the detection light beam 80A travels between mirror 30 and photosensor 33 is parallel and close to the path in which reference light beam 80R travels between mirror 92 and photosensor 36.

Obviously, the paths of detection beam 80A and reference beam 80R are substantially the same between laser 17 and sensor 33 or 36, in both length and location, unlike in the apparatus (FIG. 1) according to the first embodiment. Therefore, when these beams 80A and 80R are influenced by convection, they will be affected to almost the same extent. The phase shifts in beams 80A and 80R, which have resulted from the convection, are canceled out by phase meter 38, whereby the phase shift $\phi_A$ representing the displacement between wafer 12 and mask 13 is detected more accurately than in the first embodiment. The fourth embodiment can, therefore, align wafer 12 with respect to mask 13 with a higher precision than the first embodiment (FIG. 1).

Figure 23:
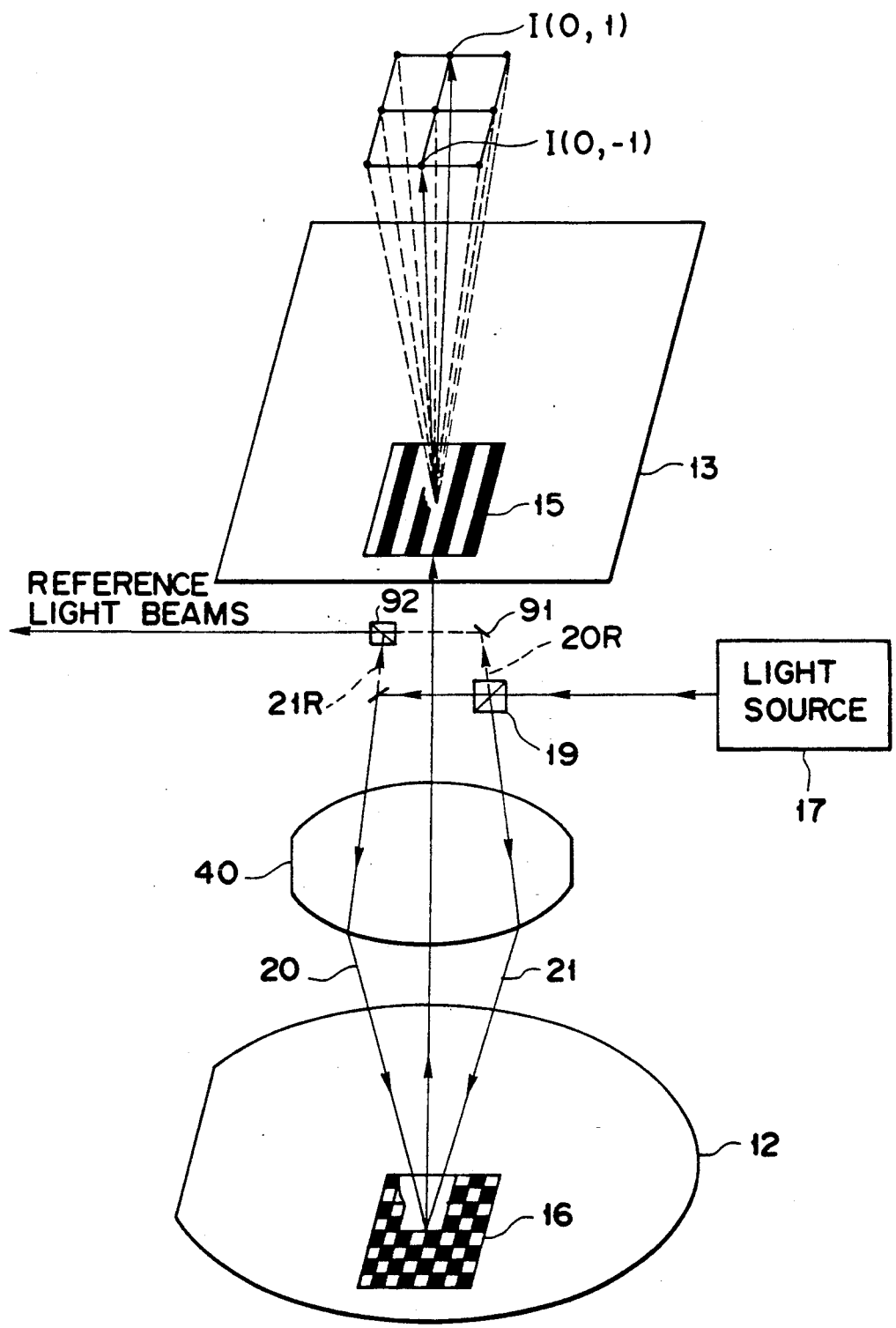
FIG. 23 schematically illustrates a modification of the fourth embodiment, designed to align, with respect to a wafer, a mask used in a reduced projection exposure apparatus.

The fourth embodiment can be applied to a reduced projection exposure apparatus, as is shown in FIG. 23. when it is applied to this exposure apparatus, the reflected component 20R of first light beam 20 and the reflected component 21R of second light beam 21a are applied via projection lens 40 located between wafer 12 and mask 13 and made to interfere with each other, thus forming a reference light beam.

Figure 21:
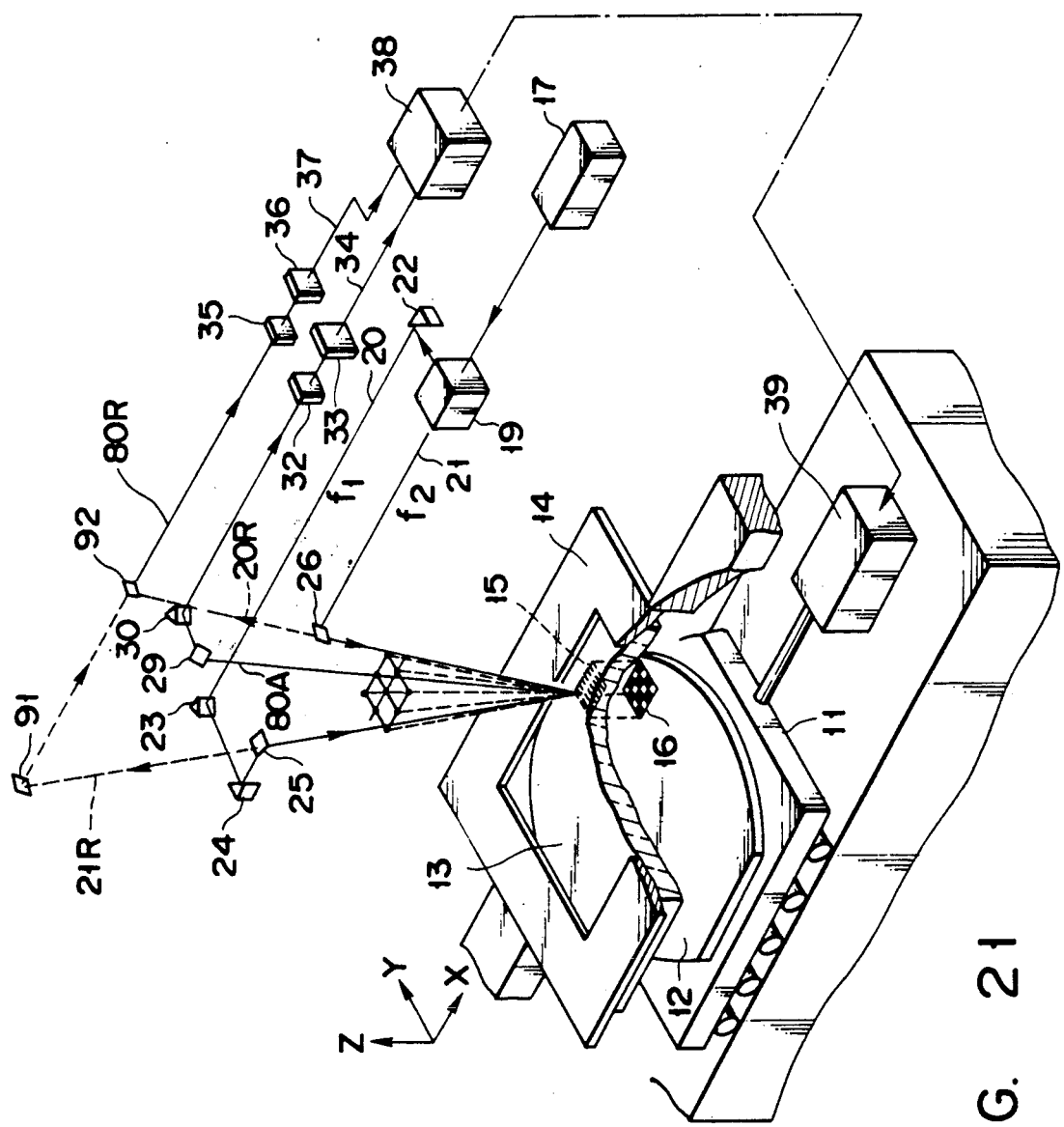
FIG. 21 is a perspective view showing an apparatus according to a fourth embodiment of the invention, which is designed to align an X-ray exposure mask and a semiconductor wafer.
Figure 24:
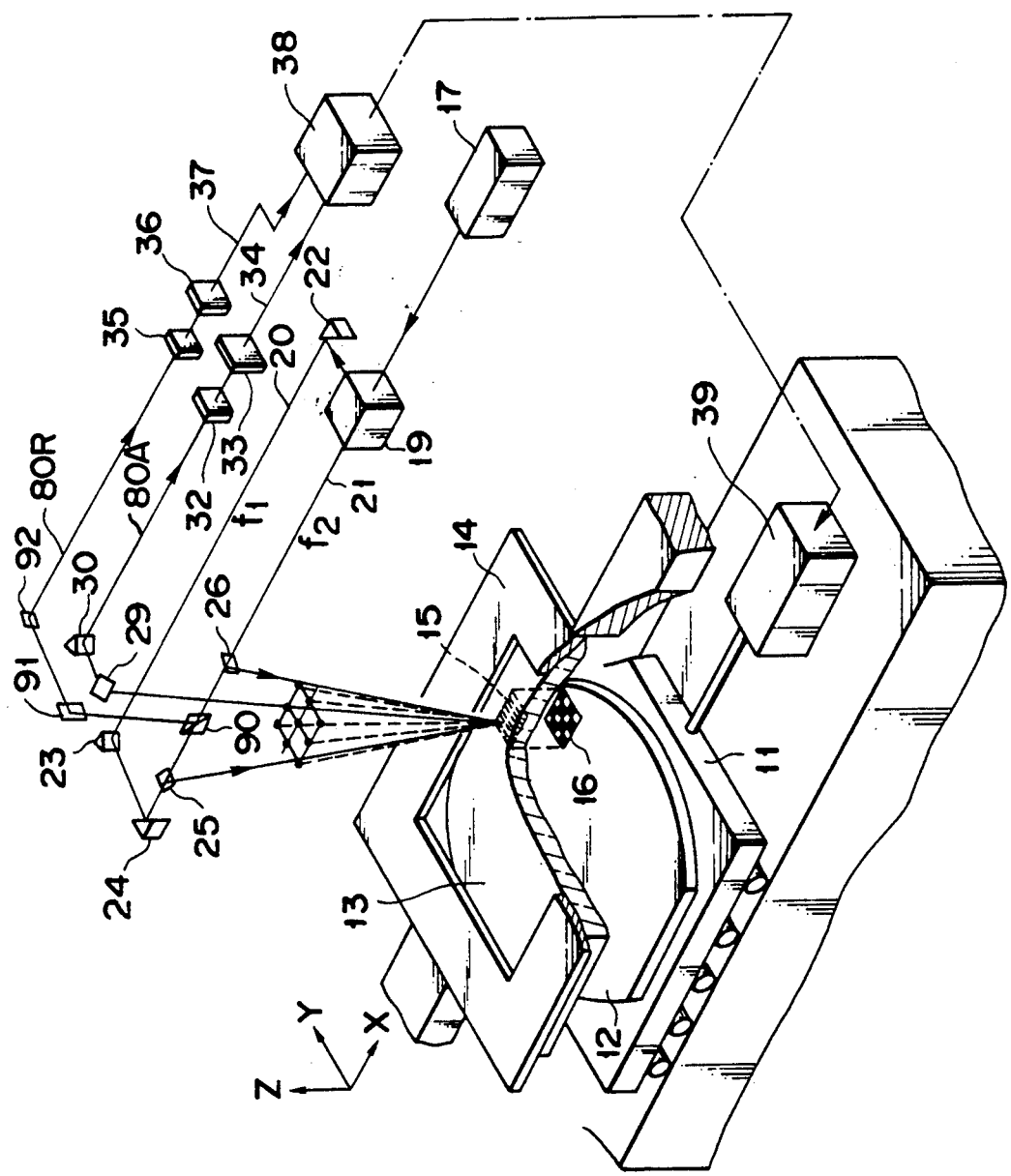
FIG. 24 is a perspective view showing an apparatus according to another modification of fourth embodiment of the invention, which is designed to align an X-ray exposure mask and a semiconductor wafer.

FIG. 24 illustrates a modification of the fourth embodiment. As may be evident from FIGS. 21 and 24, the nearer the point where the reference light beam is branched from light beams 20 and 21 is to first diffraction grating 15, the greater the influence of convection on components 20R and 21R. In this modification, first light beam 20 and second light beam 21 are applied to half mirrors 25 and 26. Mirror 25 divides beam 20 into two beams, one applied to first grating 15, and the other applied to prism 90. Mirror 26 divides beam 21 into two beams, one applied to first grating 15, and the other applied to mirror 90. The beams applied from mirrors 25 and 26 to prism 90 are combined into reference light beam 80A. As is evident from FIG. 24, first light beam 20 and second light beam 21 travel from beam splitter 19 to mirrors 25 and 26, for substantially the same distance. Further, reference light beam 80R and detection light beam 80A emerging from first diffraction grating 15 travel in paths which have substantially the same length and are very close to each other, unlike in the apparatus (FIG. 1) according to the first embodiment. Therefore, when light beams 20 and 21 are influenced by convection, the two components of either beam, which will be divided into one half component of detection beam 80A and one half component of reference beam 80R, are influenced to exactly the same extent. Similarly, when light beams 80A and 80R are influenced by convection, they will be affected to almost the same extent. The phase shifts in beams 80A and 80R, which have resulted partly from the convection which have influenced beams 20 and 21, and partly from the convection which have affected beams 80A and 80R, are canceled out by phase meter 38, whereby the phase shift $\phi_A$ representing the displacement between wafer 12 and mask 13 is detected more accurately than in the first embodiment. The modification (FIG. 24) can, therefore, position wafer 12 with respect to mask 13 as precisely as the fourth embodiment (FIG. 21).

Figure 25:
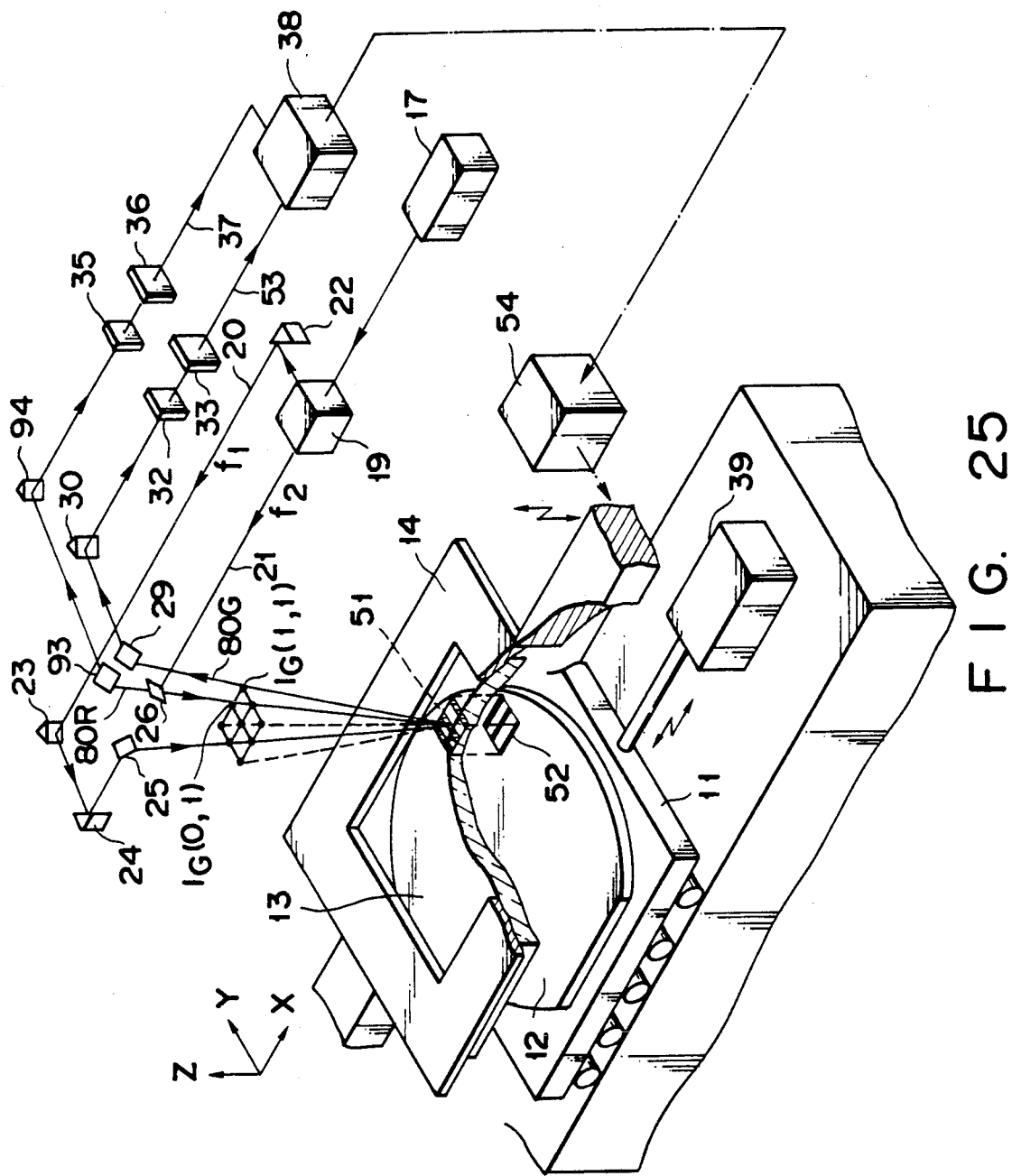
FIG. 25 is a perspective view showing an apparatus according to a fifth embodiment of the invention, which is designed to space an X-ray exposure mask apart from a semiconductor wafer for a desired distance.
Figure 26:
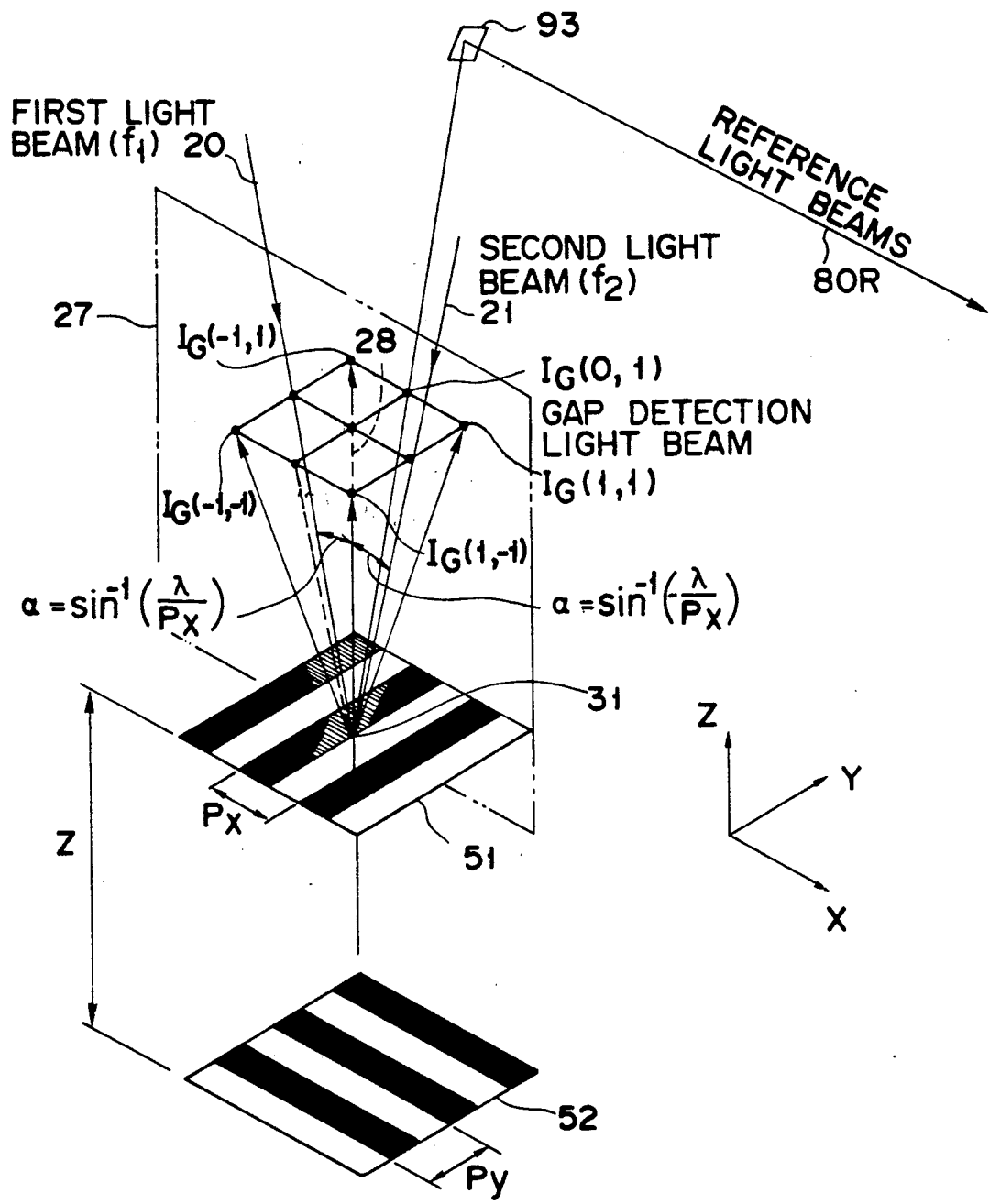
FIG. 26 is a diagram representing the two-dimensional distribution of the thrice diffracted light beam obtained when a light beam is applied to the diffraction grating of the mask perpendicular to the y axis.

The fifth embodiment of the invention will now be described, with reference to FIGS. 25 and 26. This embodiment is a modification of the second embodiment (FIG. 10) which is designed to space a wafer and a mask apart for a desired distance. In the fifth embodiment, those components of thrice diffracted light beams, which have the $I_G(0, 1)$ order, are reference light beam 80R. The component of either light beam, which is of the $I_G(0, 1)$ order, can be given as follows:

$$I_G(0, 1) \propto a \cdot f(\Delta z) \cdot \cos\{2\Delta \pi f t\} \quad (22)$$

where a is a constant not zero.

These components of the $I_G(0, 1)$ order are, of course, in phase with beams 20 and 21 and, hence, represent neither the displacement between wafer 12 and mask 13 nor the gap between them. This is why the $I_G(0, 1)$ order beams can be used as a reference light beam.

As in the fourth embodiment (FIG. 21), reference light beam 80R and detection light beam 80G, travel in paths which are almost identical between laser 17 and first grating 15. In addition, the path in which the detection light beam 80G travels between mirror 30 and photosensor 33 is parallel an close to the path in which reference light beam 80R travels between mirror 92 and photosensor 36. Obviously, the paths of detection beam 80G and reference beam 80R are substantially the same in both length and location, unlike in the apparatus (FIG. 10) according to the second embodiment. Therefore, when these beams 80G and 80R are influenced by convection, they will be affected to almost the same extent. The phase shifts in beams 80G and 80R, which have resulted from the convection, are canceled out by phase meter 38, whereby the phase shift $\phi_G$ representing the gap between wafer 12 and mask 13 is detected more accurately than in the second embodiment. The fifth embodiment can, therefore, space wafer 12 with respect to mask 13 with a higher precision than the second embodiment (FIG. 10).

Still further, second diffraction grating 52 can have such a two-dimensional pattern as is illustrated in FIG. 8. In this case, the thrice diffracted light beams have no such an order beams that they can be used reference beam. Thus, the reflected components of first and second beams 20 and 21 are combined into a light beam, and this composite beam is used as the reference light beam 80R, as in the case of the fourth embodiment.

The fifth embodiment can be applied to a reduced projection exposure apparatus, as is shown in FIG. 14. When it is applied to this exposure apparatus, $I_G(0, 1)$ order beam is used as a reference light beam.

In the fifth embodiment, reference light beam 80R need not be limited to the $I_G(0, 1)$ order. A beam of the $I_G(0, r)$ order can be used instead.

Figure 27:
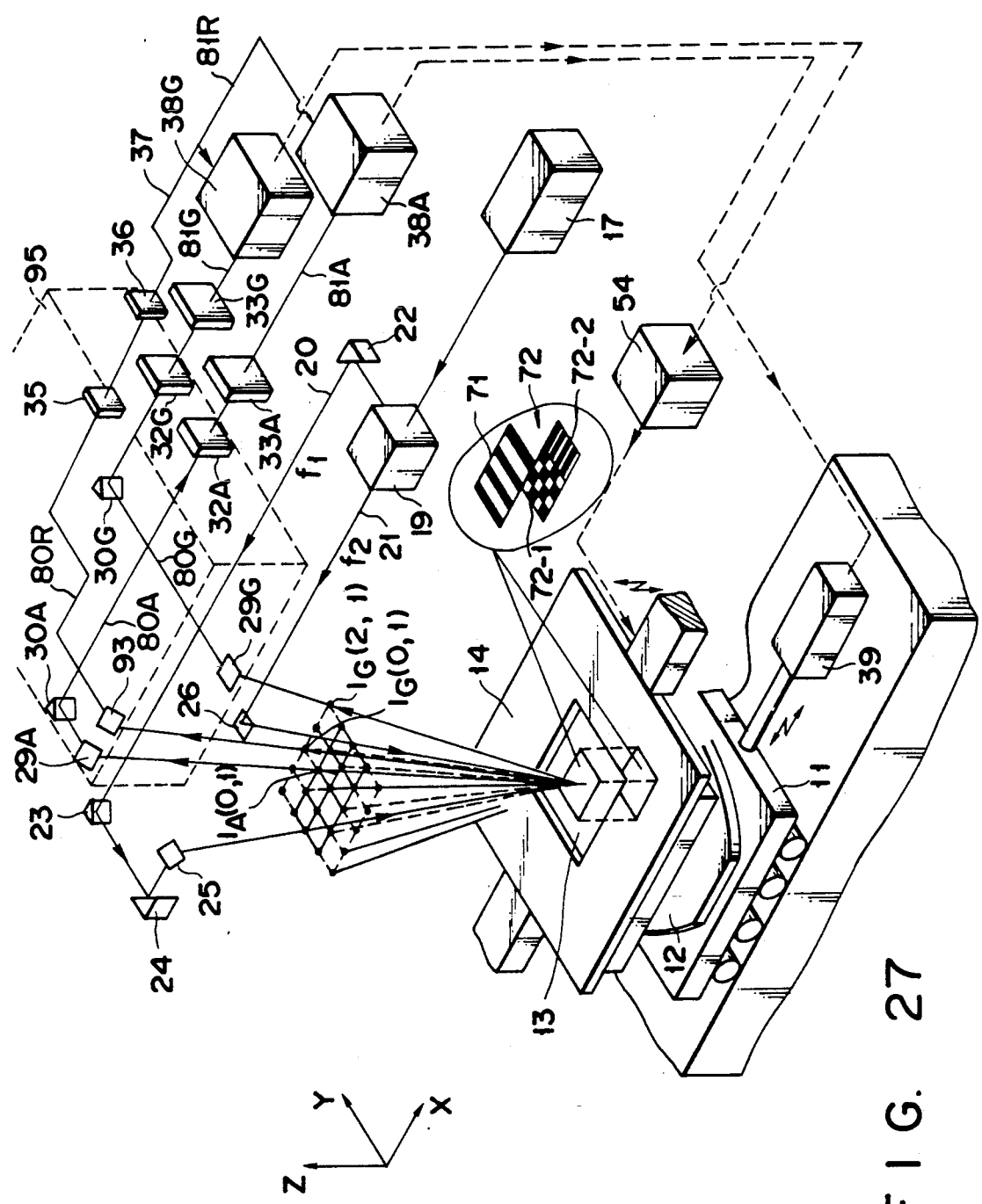
FIG. 27 is a perspective view showing an apparatus according to a sixth embodiment of the invention, which is designed to align an X-ray exposure mask and a semiconductor wafer and also to space the X-ray exposure mask apart from the semiconductor wafer for a desired distance.
Figure 28:
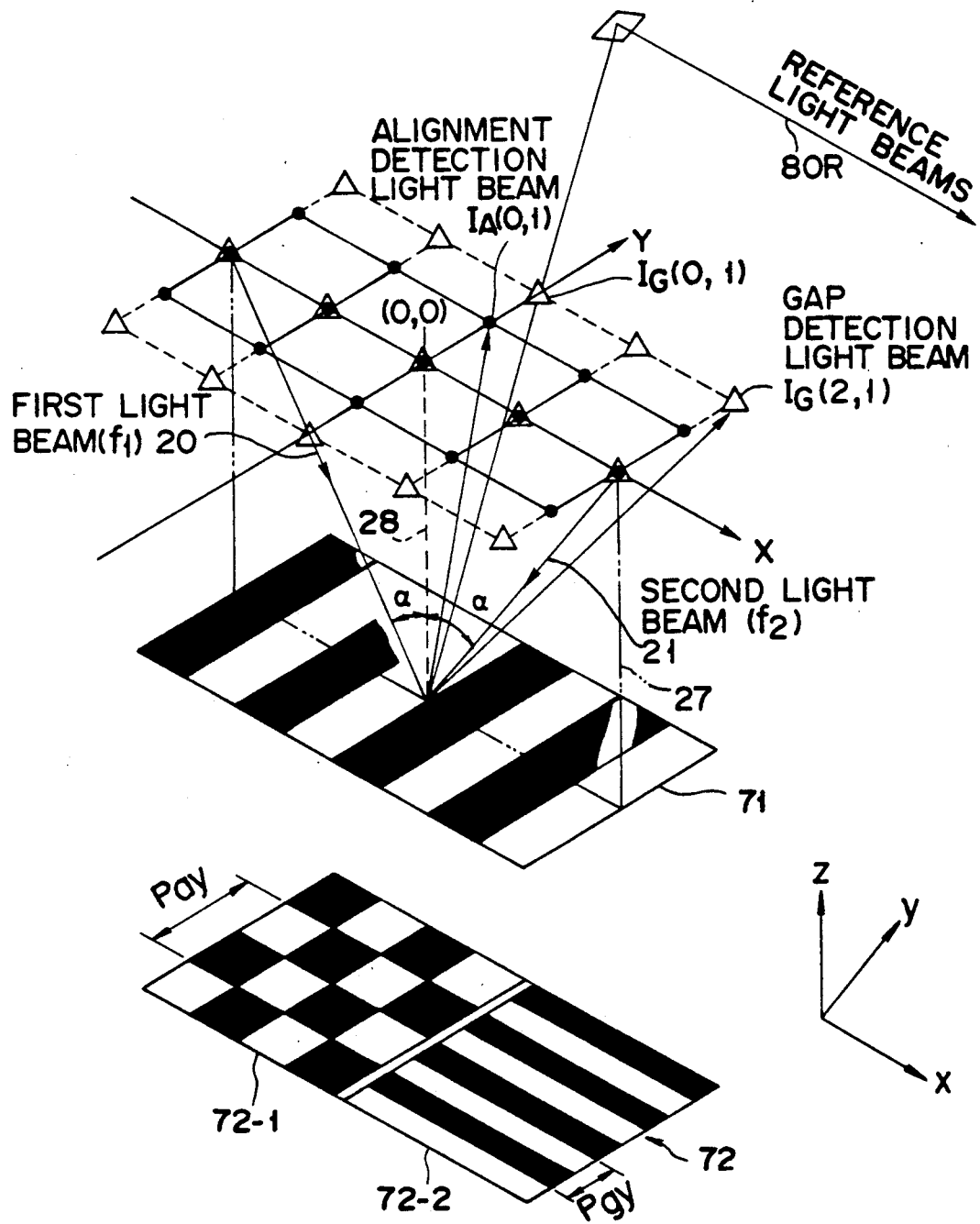
FIG. 28 is a diagram representing the two-dimensional distribution of the thrice diffracted light beam obtained when a light beam is applied to the diffraction grating of the mask perpendicular to the y axis.

Now, the sixth embodiment of the present invention will be described with reference to FIGS. 27 and 28. This embodiment is a modification of the third embodiment (FIG. 15) which is designed to not only align wafer 12 with respect to mask 13, but also space mask 13 away from wafer 12 for a desired distance. The $I_A(n, r)$ order beams of the thrice diffracted light beams are the detection beams representing the displacement between wafer 12 and mask 13. The $I_G(n, r)$ order beams of the thrice diffracted light beams are the detection beams representing the gap between wafer 12 and mask 13. The $I_A(n, r)$ order beams and the $I_G(n, r)$ order beams are distributed in different directions with respect to the y axis. As in the fifth embodiment, light beams of the $I_G(0, 1)$ order are used as the reference light beam for the same reason. Since the beams of the $I_A(0, 1)$ order, the beams of the $I_G(2, 1)$ order, and the beams of the $I_G(0, 1)$ order have different angles of diffraction, they do not interfere with one another. More specifically, as is shown in FIG. 28, since pitch Pay in y-axis of the checkerboard pattern is different from pitch Pgy in y-axis of the one-dimensional pattern (Pay $\neq$ Pgy), the checkered pattern and the one-dimensional pattern have different angles of diffraction.

Except for the aspects described in the preceding paragraph, the sixth embodiment (FIG. 27) is identical to the fifth embodiment in structure. It can, therefore, align wafer 12 and mask 13 and also adjust the gap therebetween with high precision since the detection beam and the reference beam are influenced by disturbances such as convention to substantially the same extent.

Further, deflection plates 32A, 32G, and 35, mirrors 29A, 30A, 29G, 30G, and 93—all used in the sixth embodiment (FIG. 27)—can be incorporated into a single small optical system. Moreover, the sixth embodiment can be applied to a reduced projection exposure apparatus, as is shown in FIG. 20. If this is the case, $I_G(0, 1)$ order beams of the thrice diffracted light beams are used as a reference light beam.

Figure 29A:
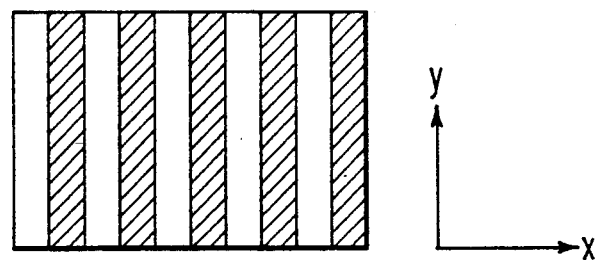
FIG. 29 (a-c) shows the plan views of three diffraction gratings which can be used in the fourth to sixth embodiments.
Figure 29B:
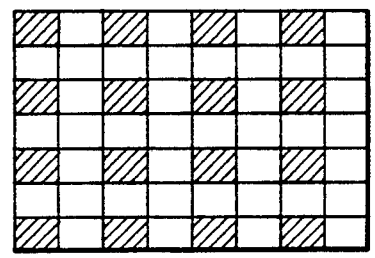
Figure 29C:
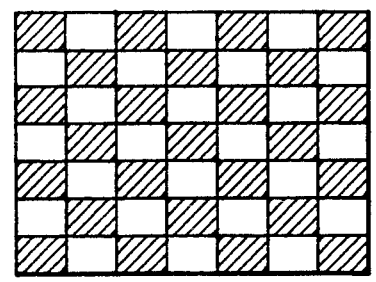

As has been explained, the fourth to sixth embodiments are designed not only to align the wafer and the mask correctly regardless of the gap between the wafer and the mask and adjust the gap regardless of the displacement between the wafer and the mask, but also to detect the gap and/or the displacement in spite of any external disturbance. Hence, it is required in these embodiments that a one-dimensional pattern be formed on mask 14 nd that a checkered pattern or a one-dimensional pattern be formed on wafer 12. Nonetheless, any other combination of diffraction patterns can be used in the case where the gap or alignment between the wafer and the mask is first controlled to some extent, and is then controlled more accurately, not influenced by the external disturbance. For instance, at least one of the three patterns shown in FIG. 29, i.e., a one-dimensional pattern (a), a two-dimensional pattern (b) and a checkered pattern (c), can be formed on a first object, and at least one of these patterns can be formed on a second object. To be more precise, in the fourth embodiment, the checkered pattern (c) and the one-dimensional pattern (a) are formed on the first and second objects, respectively, and the light beams reflected from the pattern (c) may be used as reference beam. Further, also in the fourth embodiment, two one-dimensional patterns (a), whose stripes extend in the same direction, may be formed on the first and second objects, respectively, and the light beams reflected from the pattern first on the first object may be used as reference beam. In either case, the first and second object can be correctly aligned, despite the external disturbance.

Each of the above disclosed embodiments of the present invention can also be further modified to utilize incident light that is circularly polarized light or non-polarized light. The modifications needed to be made to the embodiments disclosed earlier with respect to when circularly polarized or non-polarized light is utilized are described in FIGS. 30 and 31, respectively, as will be further described below.

Figure 30:
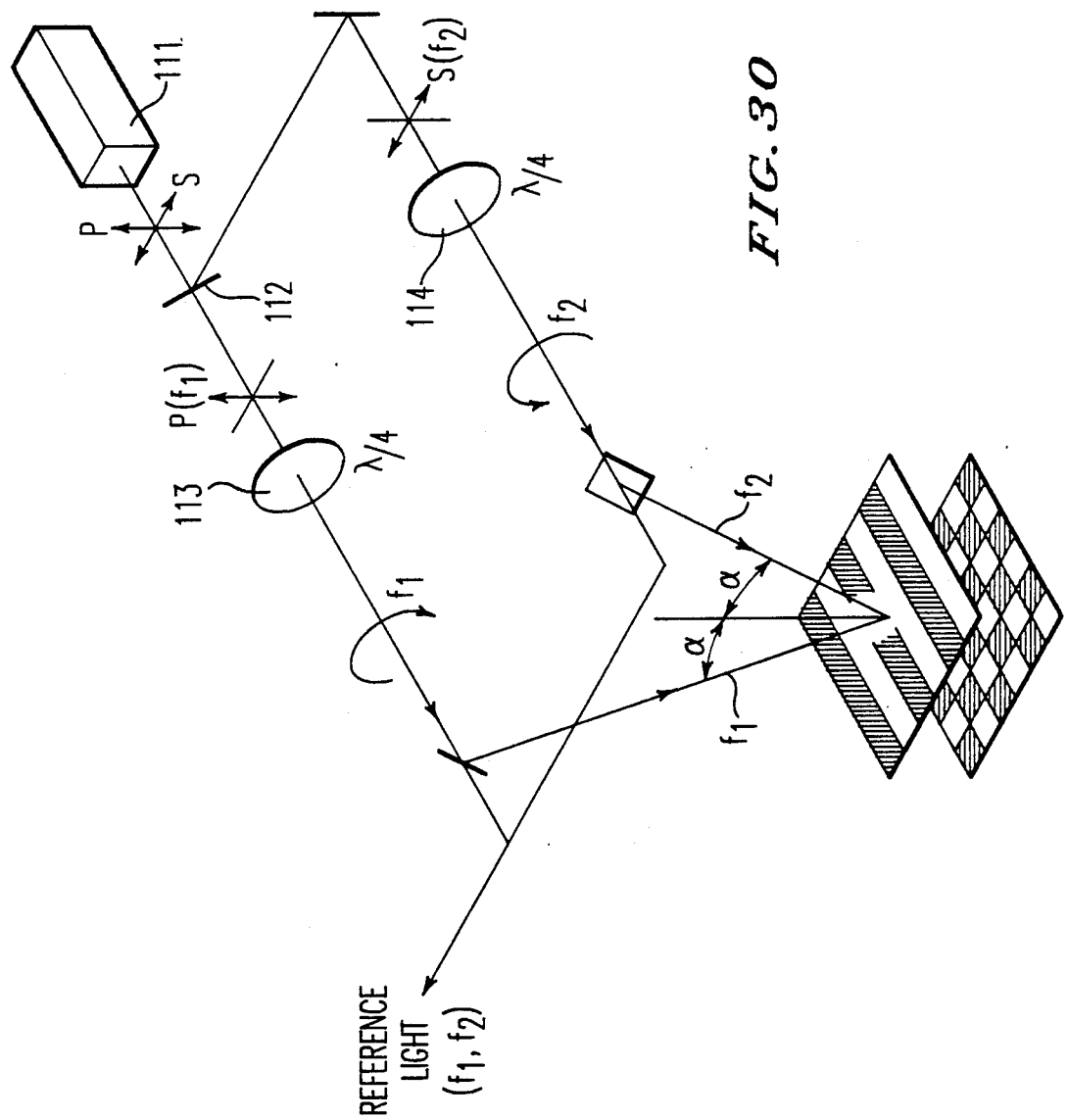
FIG. 30 is a diagram showing how circularly polarized light can be used as the incident light in any of the above embodiments.

As shown in FIG. 30, a linearly polarized light beam is emitted from Zeemen-effect laser 111. The linearly polarized light beam is split into a P wave having the frequency of $f_1$ and an S wave having the frequency of $f_2$ by polarized light beam splitter 112. After that, the P and S waves are converted into a clockwise circular polarized wave and a counter-clockwise circular polarized wave, respectively, by $\lambda/4$ phase shifters 113 and 114, respectively.

A part of each of the two circular polarized light beams are then transferred to the diffraction gratings, and the rest of each of the beams is used as the reference light. Then, a mask and wafer are aligned in a manner similar to that described in any of the above disclosed embodiments.

Figure 31:
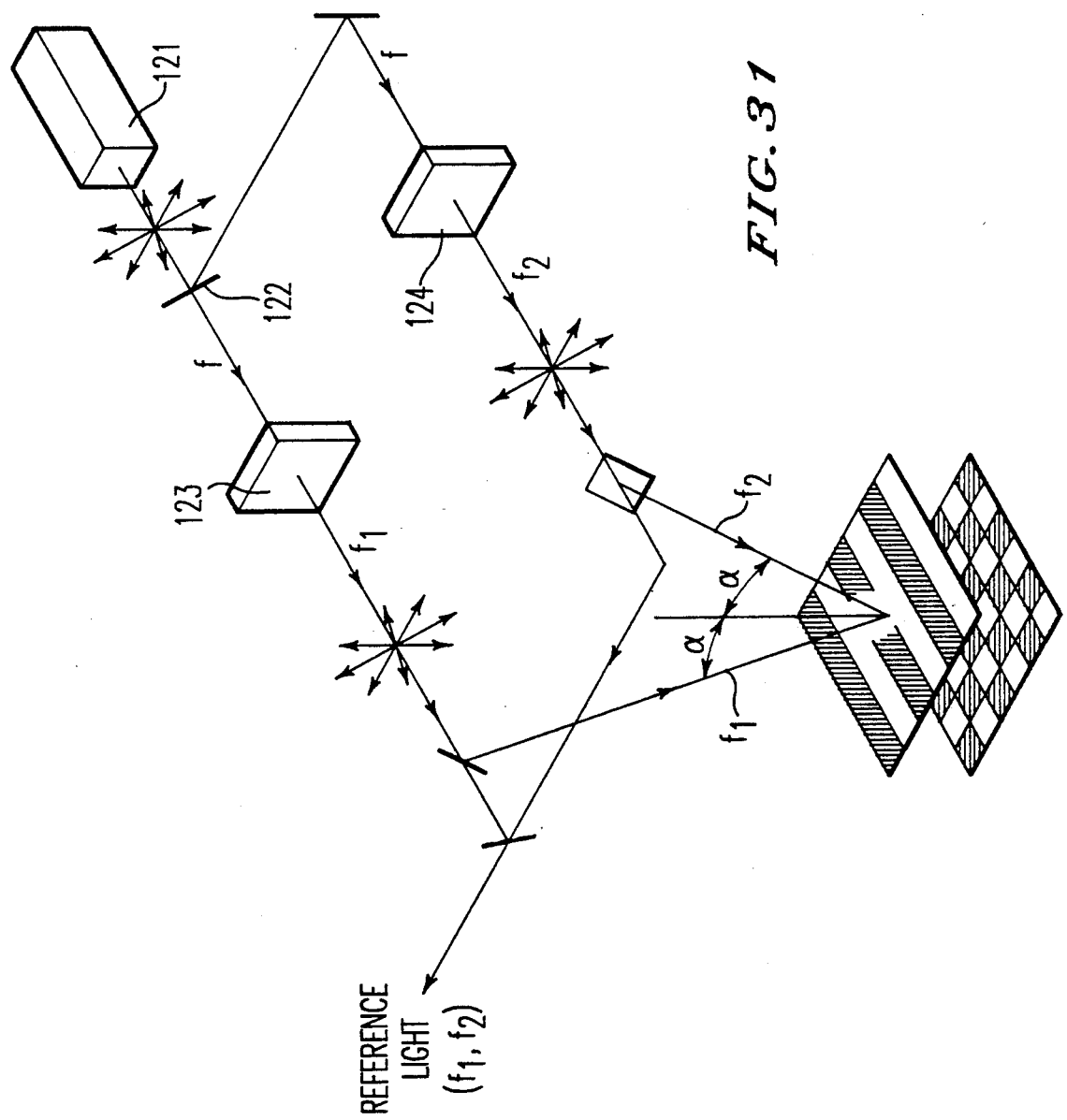
FIG. 31 is a diagram showing how non-polarized light can be used as the incident light in any of the above embodiments.

Further, FIG. 31 details how non-polarized light may be utilized as the incident light. As shown in FIG. 31, a non-polarized light beam having the single frequency (f) is emitted from laser beam source 121. This non-polarized light beam is split into two light beams (frequency f) by beam splitter 122. Then, the two light beams are converted into a non-polarized light beam having the frequency of $f_1$ and another non-polarized light beam having the frequency of $f_2$ by acoustic modulator 123 and 124, respectively.

Similar to the case shown in FIG. 30, a part of each of the two non-polarized light beams are transferred to the diffraction gratings, and the rest of each of the beams is used as the reference light. Then, a mask and wafer are aligned in a manner similar to that described in any of the above disclosed embodiments.

Utilizing circularly polarized or non-polarized light as the incident light provides certain advantages over utilizing linearly polarized light, which will now be described.

If the incident light is linearly polarized, the following defect is inevitable. That is, P and S waves are made incident on the resist of a wafer, and are reflected thereon. This resist changes in every exposure step; therefore the direction of each of the P and S waves upon reflection changes with respect to that upon incidence every time the resist changes. Therefore, in order to compensate for the above resulting difference, the direction of a polarizer of a detector must be adjusted in accordance with the directions of the changing P and S waves when detecting the P and S waves. This operation is very complicated.

On the other hand, when the incident light is non-polarized or circularly polarized, the above-stated problem does not occur. This is because neither a circularly polarized light beam or a non-polarized light beam is oriented to a certain direction. Therefore, even if the resist changes for any reason, the direction of the circularly polarized light beam or the non-polarized light beam upon reflection is the same as that upon incidence. Therefore, it is not necessary to adjust the direction of the polarizer of the detector, which procedure is very complicated as mentioned before.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by letters patent of the United States is:

1. A method of aligning first and second objects opposing each other, the first and second objects having first and second diffraction gratings, said method comprising the steps of:

emitting first and second light beams which are different in frequency and which are either circularly polarized light beams or non-polarized light beams;

making the first and second light beams incident on the first and second diffraction gratings, thereby obtaining at least twice diffracted light beams interfering with each other;

detecting a beat generated in the twice diffracted light beams;

generating third and fourth light beams which have the same frequencies as the first and second light beams, being in phase with the first and second light beams, respectively, which are circularly polarized light beams or non-polarized light beams, and are interfering with each other, and thereby obtaining a reference beat;

calculating a phase difference of the detected beat with respect to the reference beat, thereby obtaining a phase shift which corresponds to a displacement between the first and second objects; and aligning the first and second objects in accordance with the displacement, thereby to align said first and second objects with respect to each other.

2. The method according to claim 1, wherein said first object is an exposure mask, and said second object is a semiconductor wafer.

3. The method according to claim 1, wherein said first diffraction grating has a one-dimensional pattern consisting of a plurality of parallel stripes.

4. The method according to claim 3, wherein said second diffraction grating has a checkered pattern.

5. The method according to claim 3, wherein said second diffraction grating has a two-dimensional pattern consisting of a first set of parallel stripes and a second set of parallel stripes intersecting at right angles with the strips of the first set.

6. The method according to claim 4, wherein said first and second objects are moved relative to each other in an x axis, and said first diffraction grating is arranged such that said stripes extend parallel to a y axis intersecting at right angles with the x axis and existing in the same plane as the x axis.

7. The method according to claim 6, wherein the orders of said at least twice diffracted light beams are nth in the x axis and rth in the y axis and, thus, represented as (n, r), where n and r are integers; and said two light beams of the specified same order are of (0, r) order.

8. The method according to claim 6, wherein said first diffraction grating is a light-permeating one, said second diffraction grating is a light-reflecting one, so that said first and second light beams pass through said first diffraction grating and are diffracted thereby, are reflected and diffracted by said second diffraction grating, and then pass through said first diffraction grating and are diffracted by it, whereby said first light beam is changed into thrice diffracted light beams having the frequency f1, and said second light beam is changed into thrice diffracted light beams having the frequency f2; and said at least twice diffracted light beams include these thrice diffracted light beams.

9. The method according to claim 8, wherein said first and second light beams are applied to a point on said first diffraction grating, said beams extending in a second plane, being symmetrical with respect to a line, and inclining to the line at angle $\pm \alpha$, said second plane inclining at angle $\beta$ to a first plane extending at right angles to the y axis, said line extending in the second plane and at right angles to the x axis, and the point being a intersection point which the line intersects with the first grating.

10. The method according to claim 9, wherein said angle $\pm\alpha$ is $\sin^{-1}(\pm m_0\lambda/P_x)$, where $m_0$ is an integer, $\lambda$ is the standard wavelength of said first and second light beams, and $P_x$ is a pitch at which the strips of said first diffraction grating are arranged in the x axis.

11. The method according to claim 9, wherein said angle $\beta$ is 0°.

12. The method according to claim 9, wherein the stripes of said first diffraction grating are spaced apart in the x axis at regular intervals, and the squares of said second diffraction grating are spaced apart in the x axis at the same regular intervals as the stripes of the first diffraction grating.

13. The method according to claim 12, wherein said thrice diffracted light beams have orders nth order in the x axis and rth in the y axis, i.e., (n, r) order, where n and r are integers, said orders being defined with respect to an origin (0, 0) which is a point on an z' axis extending in a third plane which is symmetrical to the second plane with respect to the first plane; and said two light beams of the specified same order are of the (0, r) order which is identical to that of said thrice diffracted light beams.

14. The method according to claim 1, wherein said first and second light beams are applied to said second diffraction grating through a projection lens located between said first and second objects, after said first and second light beams have been diffracted by said first diffraction grating.

15. The method according to claim 1, wherein a projection lens is located between said first and second objects, so that the first and second light beams are applied to said second diffraction grating through the projection lens, are reflected and diffracted thereby, and then are transferred to said first diffraction grating through the projection lens.

16. The method according to claim 1, wherein said third and fourth light beams have each two components, respectively, which are divided from said first and second light beams, after said first and second light beams have been transferred to the first grating.

17. The method according to claim 16, wherein said two components are those components of said first and second light beams which have been reflected by said first diffraction grating.

18. The method according to claim 16, wherein said two light beams of the specified same order travel in a first path until they reach said first sensor means, and said two components travel in a second path until they reach said second sensor means, and said first and second paths are located close to each other and are substantially equal in length.

19. The method according to claim 1, wherein said third and fourth light beams have each two beams of the same order other than the specified order of said at least twice diffracted light beams.

20. The method according to claim 19, wherein said two light beams of the specified order travel in a first path until they reach said first sensor means, said two beams of the same order other than the specified order travel in a second path until they reach said second sensor means, and said first and second paths are located close to each other and are substantially equal in length.

21. The method according to claim 1, wherein said third and fourth light beams have each two components, respectively, which are divided from said first and second light beams before said first and second light beams are transferred to said first diffraction grating; said two light beams of the specified same order travel in a first path until they reach said first sensor means; said two components travel in a second path until they reach said second sensor means; and said first and second paths are located close to each other and are substantially equal in length.

* * * * *